(12) United States Patent
Huang et al.

(10) Patent No.: US 12,557,710 B2
(45) Date of Patent: Feb. 17, 2026

(54) SEMICONDUCTOR DEVICE, ELECTRONIC DEVICE INCLUDING THE SAME, AND MANUFACTURING METHOD THEREOF

(71) Applicant: Taiwan Semiconductor Manufacturing Company, Ltd., Hsinchu (TW)

(72) Inventors: Kuan-Yu Huang, Taipei (TW); Sung-Hui Huang, Yilan County (TW); Shang-Yun Hou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 782 days.

(21) Appl. No.: 17/873,168

(22) Filed: Jul. 26, 2022

(65) Prior Publication Data
US 2022/0359357 A1 Nov. 10, 2022

Related U.S. Application Data

(62) Division of application No. 16/798,404, filed on Feb. 23, 2020, now Pat. No. 11,569,156.
(Continued)

(51) Int. Cl.
*H01L 23/498* (2006.01)
*H01L 21/48* (2006.01)
(Continued)

(52) U.S. Cl.
CPC .... *H01L 23/49816* (2013.01); *H01L 21/4853* (2013.01); *H01L 23/04* (2013.01);
(Continued)

(58) Field of Classification Search
CPC ..... H01L 23/04; H01L 23/053; H01L 23/145; H01L 23/488; H01L 23/49816;
(Continued)

(56) References Cited

U.S. PATENT DOCUMENTS

| 8,993,380 B2 | 3/2015 | Hou et al. |
| 9,281,254 B2 | 3/2016 | Yu et al. |

(Continued)

FOREIGN PATENT DOCUMENTS

| CN | 1738039 | 2/2006 |
| CN | 105304580 | 2/2016 |

(Continued)

OTHER PUBLICATIONS

"Notice of allowance of China Counterpart Application", issued on Jan. 1, 2025, p. 1-p. 5.

*Primary Examiner* — Marcos D. Pizarro
(74) *Attorney, Agent, or Firm* — JCIPRNET

(57) ABSTRACT

A semiconductor device includes a circuit substrate, a semiconductor package, connective terminals and supports. The circuit substrate has a first side and a second side opposite to the first side. The semiconductor package is connected to the first side of the circuit substrate. The connective terminals are located on the second side of the circuit substrate and are electrically connected to the semiconductor package via the circuit substrate. The supports are located on the second side of the circuit substrate beside the connective terminals. A material of the supports has a melting temperature higher than a melting temperature of the connective terminals.

20 Claims, 16 Drawing Sheets

Related U.S. Application Data

(60) Provisional application No. 62/926,562, filed on Oct. 27, 2019.

(51) Int. Cl.
*H01L 23/00* (2006.01)
*H01L 23/04* (2006.01)
*H01L 23/053* (2006.01)
*H01L 23/31* (2006.01)
*H01L 23/538* (2006.01)

(52) U.S. Cl.
CPC .......... *H01L 23/041* (2013.01); *H01L 23/053* (2013.01); *H01L 23/3128* (2013.01); *H01L 23/498* (2013.01); *H01L 23/49811* (2013.01); *H01L 23/49827* (2013.01); *H01L 23/538* (2013.01); *H01L 23/5383* (2013.01); *H01L 23/5384* (2013.01); *H01L 23/562* (2013.01)

(58) Field of Classification Search
CPC ............... H01L 23/5385; H01L 23/562; H01L 21/4853; H01L 21/50; H01L 24/10; H01L 24/81; H01L 2224/1012; H01L 2224/16225; H01L 2224/32225; H01L 2224/73204; H01L 2224/81007; H01L 2224/81097; H01L 2924/15311; H01L 2924/16152; H01L 2924/18161; H01L 23/041; H01L 23/3128; H01L 23/498; H01L 23/49811; H01L 23/49827; H01L 23/538; H01L 23/5383; H01L 23/5384

See application file for complete search history.

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 9,899,305 B1* | 2/2018 | Yeh ................. H01L 23/562 |
| 2010/0123215 A1* | 5/2010 | Pan ................. H01L 23/5286 257/532 |
| 2015/0162307 A1* | 6/2015 | Chen ................. H01L 21/56 438/107 |
| 2019/0273030 A1* | 9/2019 | Lim ................. H01L 23/3675 |
| 2020/0144192 A1* | 5/2020 | Choi ................. H01L 23/13 |
| 2020/0365572 A1* | 11/2020 | Su ................. H01L 23/053 |
| 2021/0020459 A1* | 1/2021 | Shah ................. H01L 23/3142 |

FOREIGN PATENT DOCUMENTS

| | | |
|---|---|---|
| WO | 2009038169 | 3/2009 |
| WO | 2009157321 | 12/2009 |

* cited by examiner

SEMICONDUCTOR DEVICE, ELECTRONIC DEVICE INCLUDING THE SAME, AND MANUFACTURING METHOD THEREOF

CROSS-REFERENCE TO RELATED APPLICATION

This application is a divisional application of and claims the priority benefit of a prior application Ser. No. 16/798,404, filed on Feb. 23, 2020, which claims the priority benefit of U.S. provisional application Ser. No. 62/926,562, filed on Oct. 27, 2019. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
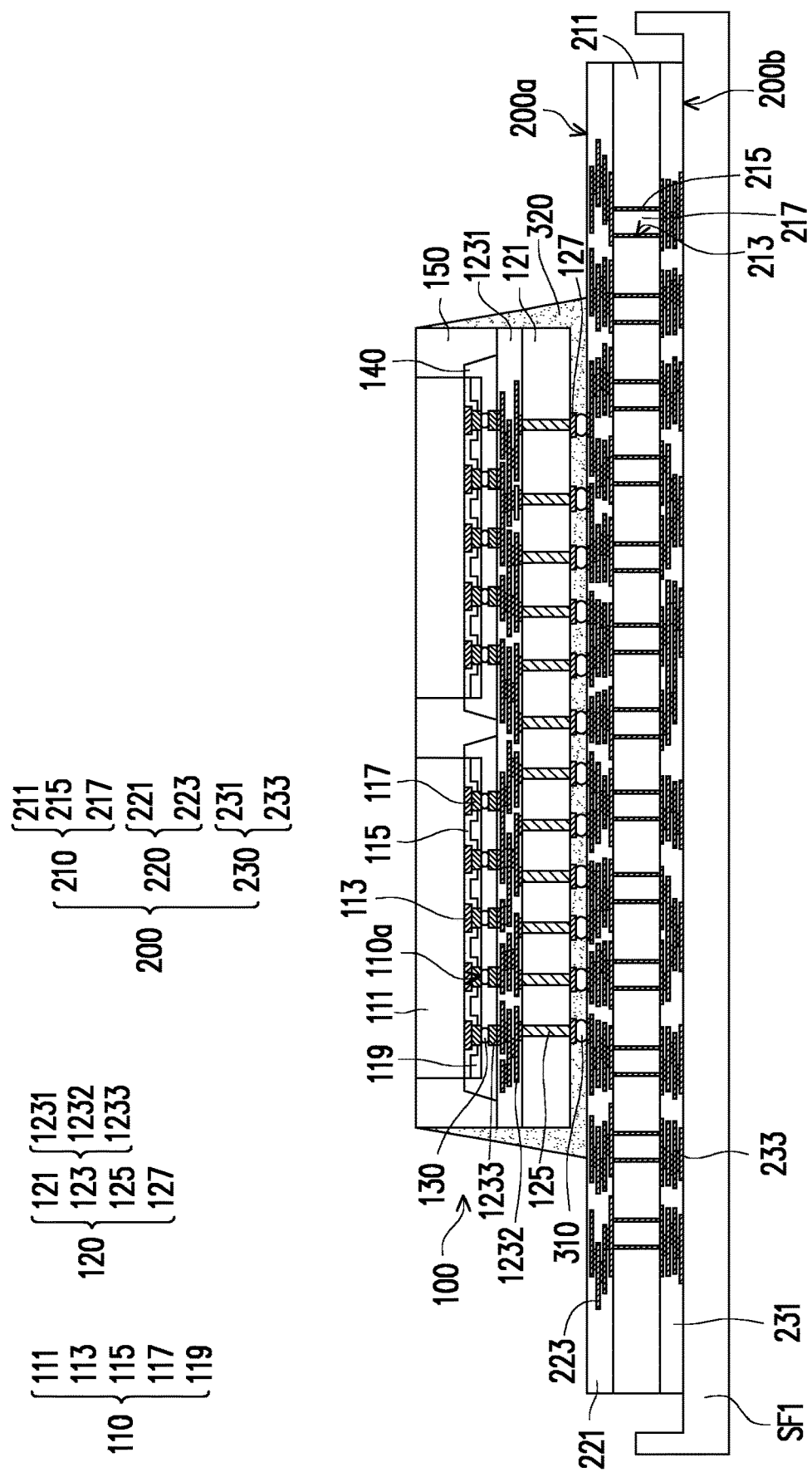
FIG. 1A to FIG. 1G are schematic cross-sectional views of structures produced at various stages of a manufacturing method of a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1G are schematic cross-sectional views of structures produced at various stages of a manufacturing method of a semiconductor device 10 according to some embodiments of the present disclosure. Referring to FIG. 1A, in some embodiments a semiconductor package 100 is provided. In some embodiments, the semiconductor package 100 includes one or more chips 110. In some embodiments, each chip 110 includes a semiconductor substrate 111, contact pads 113 and a passivation layer 115. The contact pads 113 may be formed on a top surface of the semiconductor substrate 111. The passivation layer 115 may cover the top surface of the semiconductor substrate 111 and have a plurality of openings that exposes at least a portion of each contact pad 113. In some embodiments, a chip 110 may further include a plurality of contact posts 117 filling the openings of the passivation layer 115 and electrically connected to the contact pads 113, and a protective layer 119 surrounding the contact posts 117.

In some embodiments, the semiconductor substrate 111 may be made of semiconductor materials, such as semiconductor materials of the groups III-V of the periodic table. In some embodiments, the semiconductor substrate 111 includes elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In some embodiments, the semiconductor substrate 111 includes active components (e.g., transistors or the like) and optionally passive components (e.g., resistors, capacitors, inductors, or the like) formed therein. In certain embodiments, the contact pads 113 include aluminum pads, copper pads, or other suitable metal pads. In some embodiments, the passivation layer 115 may be a single layer or a multi-layered structure, including a silicon oxide layer, a silicon nitride layer, a silicon oxy-nitride layer, a dielectric layer formed by other suitable dielectric materials, or combinations thereof. In some embodiments, the material of the contact posts 117 includes copper, copper alloys, or other conductive materials, and may be formed by deposition, plating, or other suitable techniques. In some embodiments, any chip 110 of the semiconductor package 100 may present similar features as the ones just discussed.

Each chip 110 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, one or more chips 110 may be memory dies. The disclosure is not limited by the type of chips 110 used in the semiconductor package 100.

Referring to FIG. 1A, in some embodiments, the chips 110 are bonded to an interposer 120. In some embodiments, the interposer 120 includes a semiconductor substrate 121, an interconnection structure 123, through semiconductor vias (TSVs) 125 and contact pads 127. The semiconductor substrate 121 is made of a semiconductor material, similarly to what was previously discussed with reference to the semiconductor substrate 111 of the chips 110. In some embodiments, the interposer 120 includes a silicon wafer. In some embodiments, the interconnection structure 123 is disposed on the semiconductor substrate 121 and includes a dielectric layer 1231, conductive patterns 1232 and under-bump metallurgies 1233. For simplicity, the dielectric layer 1231 is illustrated as a single dielectric layer and the conductive patterns 1232 are illustrated as embedded in the dielectric layer 1231. Nevertheless, from the perspective of the manufacturing process, the dielectric layer 1231 is constituted by at least two dielectric layers. The conductive patterns 1232 may be sandwiched between two adjacent dielectric layers. Some of the conductive patterns 1232 may extend vertically through the dielectric layer 1231 to establish electrical connection between different metallization tiers of the interconnection structure 123. In some embodiments, the (outermost) dielectric layer 1231 may be patterned to expose the underlying conductive patterns 1232. The under-bump metallurgies 1233 may optionally be conformally formed in the openings of the (outermost) dielectric layer 1231 exposing the conductive patterns 1232 and may further extend over portions of the exposed surface of the (outermost) dielectric layer 1231. In some embodiments, the under-bump metallurgies 1233 include multiple stacked layers. For example, the under-bump metallurgies 1233 may include one or more metallic layers stacked on a seed layer. In some embodiments, the material of the dielectric layer 1231 includes polyimide, epoxy resin, acrylic resin, phenol resin, benzocyclobutene (BCB), polybenzoxazole (PBO), or any other suitable polymer-based dielectric material. The dielectric layer 1231, for example, may be formed by suitable fabrication techniques such as spin-on coating, chemical vapor deposition (CVD), plasma-enhanced chemical vapor deposition (PECVD), or the like. In some embodiments, materials of the conductive patterns 1232 and the under-bump metallurgies 1233 include aluminum, titanium, copper, nickel, tungsten, or alloys thereof. The conductive patterns 1232 and the under-bump metallurgies 1233 may be formed by, for example, electroplating, deposition, and/or photolithography and etching. It should be noted that the number of the dielectric layers 1231, the number of the conductive patterns 1232 and the number of under-bump metallurgies 1233 illustrated in FIG. 1A are merely for illustrative purposes, and the disclosure is not limited thereto. In some alternative embodiments, fewer or more layers of the dielectric layers 1231, conductive patterns 1232 or under-bump metallurgies 1233 may be formed depending on the circuit design.

In some embodiments, as illustrated in FIG. 1A, the TSVs 125 are formed in the semiconductor substrate 121, and provide dual-side electrical connection through the semiconductor substrate 121. In some embodiments, one end of a TSV 125 is connected to the conductive patterns 1232 of the interconnection structure 123 and the other end of the same TSV 125 is connected to a contact pad 127 formed on a side of the semiconductor substrate 121 opposite to the interconnection structure 123. In some embodiments, a material of the TSVs 125 includes one or more metals. In some embodiments, the metal material of the TSVs 125 includes copper, titanium, tungsten, aluminum, combinations thereof, or the like.

In some embodiments, the chips 110 are bonded via connectors 130 to the interposer 120. In some embodiments, the connectors 130 are micro-bumps installed on the contact posts 117 and sandwiched between the contact posts 117 and the under-bump metallurgies 1233 or the TSVs 125 (if no interconnection structure 123 is included in the interposer 120). According to some embodiments, the chips 110 are disposed with the active surfaces 110a (the surfaces exposing the contact posts 117 or the contact pads 113 when no contact posts 117 are included) facing the interposer 120.

In some embodiments, an underfill 140 may be disposed between the chips 110 and the interposer 120 to protect the connectors 130 against thermal or physical stresses and secure the electrical connection of the chips 110 to the interposer 120. In some embodiments, the underfill 140 is formed by capillary underfill filling (CUF). A dispenser (not shown) may apply a filling material (not shown) along the perimeter of the chips 110. In some embodiments, heating or thermal treatment may be applied to let the filling material penetrate in the interstices defined by the connectors 130 between the chips 110 and the interposer 120 by capillarity. In some embodiments, a curing process is performed to consolidate the underfill 140. In some embodiments, as shown in FIG. 1A, multiple underfill portions 140 are formed, each portion securing the connectors 130 of a chip 110. In some alternative embodiments, a single underfill (not shown) may extend below the chips 110 depending on the spacing and relative positions of the chips over the interposer 120.

Referring to FIG. 1A, an encapsulant 150 is formed over the interposer 120 wrapping the chips 110 and the underfills 140. In some embodiments, the encapsulant 150 is formed by completely covering the chips 110 with an encapsulation material (not shown), and then performing a planarization process (e.g., a mechanical grinding process and/or a chemical mechanical polishing step) until the backside surfaces of the chips are exposed. In some embodiments, the encapsulation material may be a molding compound, a molding underfill, a resin (such as an epoxy resin), or the like. In some embodiments, the encapsulation material is formed by an over-molding process. In some embodiments, the encapsulation material is formed by a compression molding process. In some embodiments, the encapsulation material may require a curing step.

In FIG. 1A only two chips 110 are shown on the interposer 120 for simplicity, but the disclosure is not limited thereto. In some embodiments, the semiconductor package 100 may include more or fewer chips 110 than what illustrated in FIG. 1A, as well as other components (e.g., dummy dies, stress release layers, interconnect structures, support pillars, etc.). Furthermore, whilst the process is currently being illustrated for a Chip-on-Wafer-(CoW) package 100, the disclosure is not limited to the package structure shown in the drawings, and other types of semiconductor package such as integrated fan-out (InFO) packages, package-on-packages (PoP), etc., are also meant to be covered by the present disclosure and to fall within the scope of the appended claims.

Referring to FIG. 1A, in some embodiments a circuit substrate 200 is disposed on a supporting frame SF1, and the semiconductor package 100 is connected to a side 200a of the circuit substrate 200. In some embodiments, the circuit substrate 200 includes a core layer 210 and build-up layers 220, 230 disposed on opposite sides of the core layer 210. The core layer 210 may include a dielectric layer 211 including through holes 213 which cross the dielectric layer 211 from side to side. The through holes 213 may be lined with conductive material forming the through vias 215. In some embodiments, the through vias 215 only partially fill (e.g., line the edges of) the through holes 213, which are filled by a dielectric filling 217. In some alternative embodiments, the through holes 213 are filled by the through vias 215. In some embodiments, each build-up layer 220 or 230 respectively includes a dielectric layer 221 or 231 and conductive patterns 223 or 233 embedded in the corresponding dielectric layer 221 or 231 and providing electrical connection between opposite sides of the corresponding dielectric layer 221 or 231. In some embodiments, the build-up layers 220, 230 may independently include more or fewer dielectric layers 221, 231 and conductive patterns 223, 233 than what is illustrated in FIG. 1A, according to the routing requirements. In some embodiments, the through vias 215 establish electrical connection between the conductive patterns 223 of one build-up layer 220 with the conductive patterns 233 of the other build-up layer 230. In some embodiments, the circuit substrate 200 is disposed on the supporting frame SF1 with the build-up layer 230 directed towards the supporting frame SF1, and the other build-up layer 220 exposed for further processing. Therefore, the semiconductor package 100 is connected to the circuit substrate 200 from the side of the build-up layer 220 (e.g., the side 200a), while an opposite side 200b of the circuit substrate 200 is directed towards the supporting frame SF1. In some embodiments, conductive terminals 310 are disposed between the contact pads 127 of the semiconductor package 100 and the portions of the conductive patterns 223 of the build-up layer 220 exposed by the (outermost) dielectric layer 221. In some embodiments, the conductive terminals 310 are C4-bumps. In some embodiments, an underfill 320 is disposed between the semiconductor package 100 and the circuit substrate 200 to protect the conductive terminals 310 from thermal and mechanical stresses.

Figure 1B:
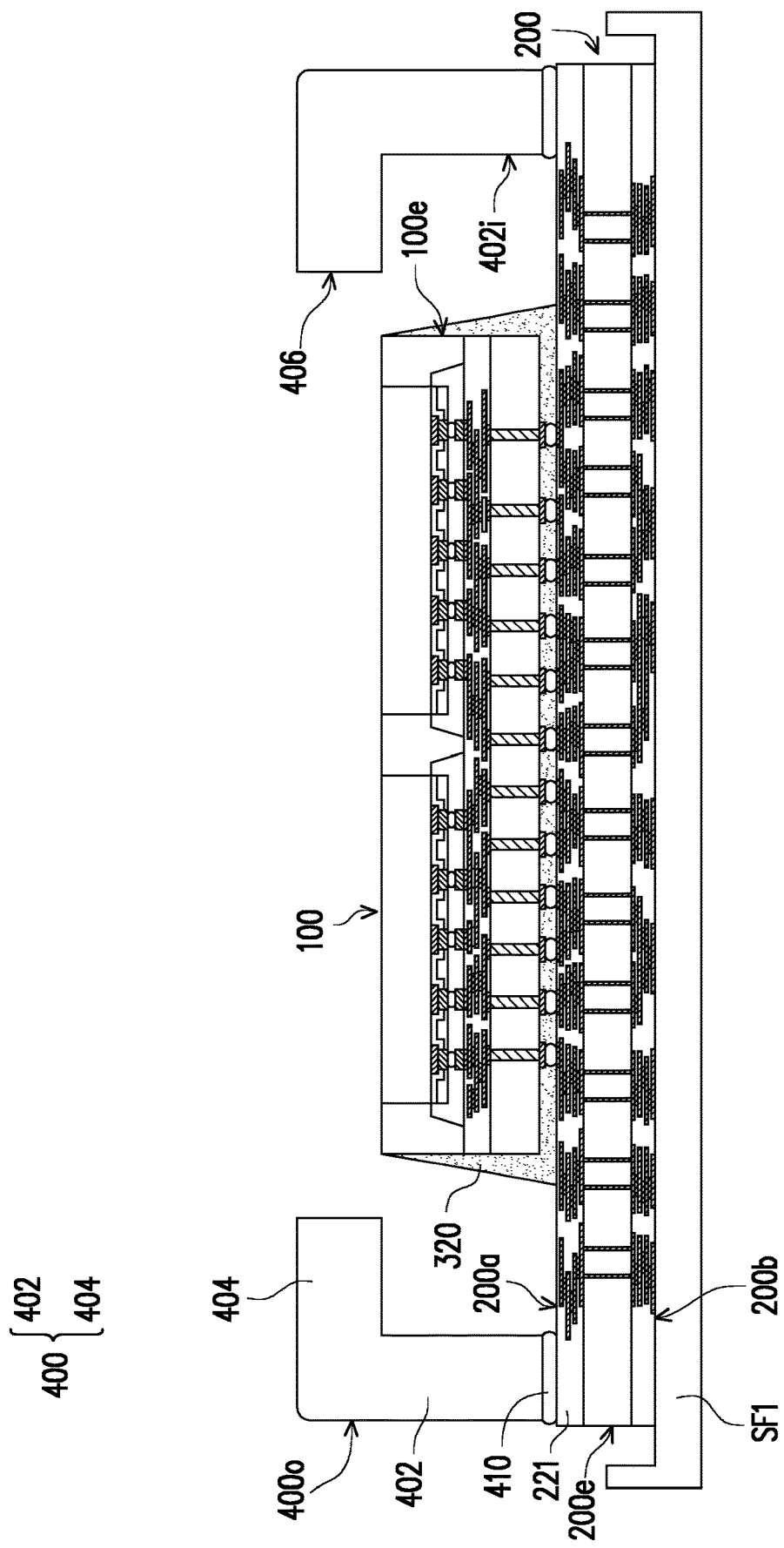

Referring to FIG. 1B, in some embodiments a ring 400 is secured to the circuit substrate 200 from the side 200a, surrounding the semiconductor package 100 and the underfill 320. In some embodiments, the ring 400 includes flanges 402 extending towards the circuit substrate 200 in a vertical direction, and a roof 404 connected to the flanges 402 and extending in a horizontal direction, substantially parallel to the circuit substrate 200. In some embodiments, an inner edge 402i of the flanges 402 faces an edge 100e of the semiconductor package 100. In some embodiments, the semiconductor package 100 is surrounded on all sides by the inner edge 402i of the flanges 402. The roof 404 may be integrally formed (formed as a single piece) with the flanges 402. In some embodiments, the flanges 402 and the roof 404 describe a right angle at their joint, but the disclosure is not limited thereto. In some embodiments, the flanges 402 are joined to the roof 404 at different angles than 90 degrees. In some embodiments, the roof 404 includes an opening 406 leaving exposed (when viewed from the top) the semiconductor package 100. In some embodiments, a heat dissipation system (not shown) may be connected to the semiconductor package 100 through the opening 406 of the roof 404. In some alternative embodiments, the roof 404 does not include an opening 406, and constitutes a lid covering the semiconductor package 100. In some embodiments, a material of the ring 400 includes a metal (e.g., copper). In some embodiments, the ring 400 may be subjected to an anodization or passivation treatment (e.g., with nickel) to enhance its environmental resistance before it is installed on the circuit substrate 200. In some embodiments, an outer edge 400o of the ring 400 opposite to the inner edge 402i is vertically aligned with an outer edge 200e of the circuit substrate 200. In some embodiments, the outer edge 200e of the circuit substrate 200 corresponds to the peripheral surface joining the side 200a with the side 200b. In some embodiments, a footprint of the ring 400 substantially matches and is aligned with the footprint of the circuit substrate 200. In some embodiments, the ring 400 may be secured to the circuit substrate 200 via a bonding material 410. A material of the bonding material 410 is not particularly limited, and may be chosen as a function of the materials used for the dielectric layer 231 and the ring 400 that the bonding material 410 has to secure together. In some embodiments, the bonding material 410 includes a thermocurable adhesive, a photocurable adhesive, a thermally conductive adhesive, a thermosetting resin, a waterproof adhesive, a lamination adhesive, or a combination thereof. In some embodiments, the bonding material 410 includes a thermally conductive adhesive. In some embodiments, the bonding material 410 includes a metallic layer (not shown) with solder paste (not shown) deposited thereon. According to the type of material used, the bonding material 410 may be formed by deposition, lamination, printing, plating, or any other suitable technique.

Figure 1C:
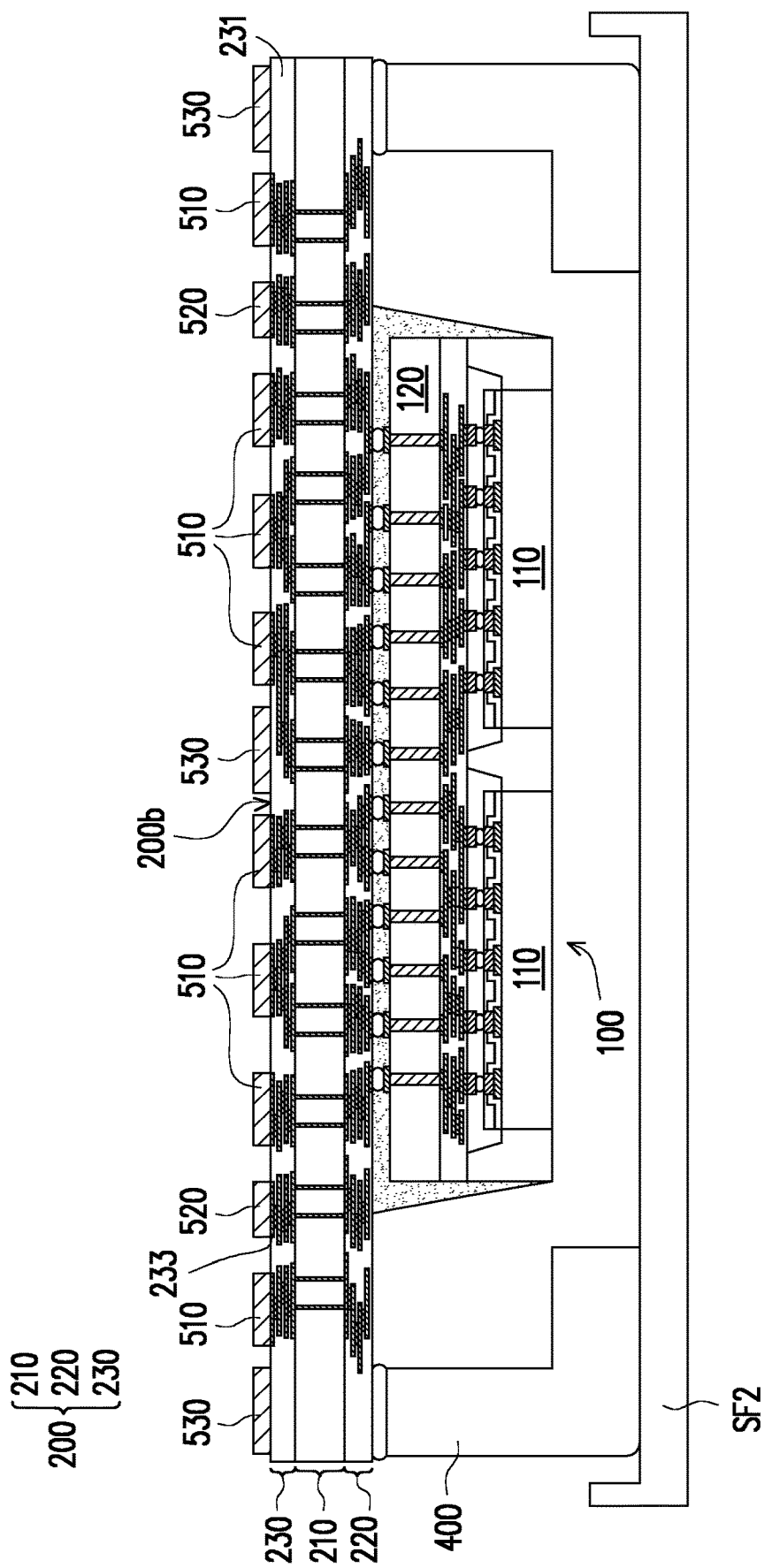

Referring to FIG. 1B and FIG. 1C, the manufacturing intermediate shown in FIG. 1B may be overturned on a supporting frame SF2. In some embodiments, the ring 400 may support the structure on the supporting frame SF2 to expose the build-up layer 230 of the circuit substrate 200 for further processing. That is, the side 200b may be exposed following overturning of the manufacturing intermediate. In some embodiments, the dielectric layer 231 may be patterned to expose portions of the conductive patterns 233 (if previously covered). In some embodiments, portions of solder material 510, 520, 530 may be disposed on the build-up layer 230. In some embodiments, the portions of solder material 510 and 520 are disposed on the openings of the dielectric layer 231 exposing the conductive patterns 233, while the portions of solder material 530 may be disposed on the dielectric layer 231. That is, the portions of solder material 510 and 520 may be electrically connected to the chips 110 of the semiconductor package 100 via the circuit substrate 200, while the portions of solder material 530 may be electrically insulated from the chips 110 or even from the conductive patterns 233 of the circuit substrate 200. In some embodiments, the solder material includes eutectic solder containing lead or lead-free. In some embodiments, the solder material includes non-eutectic solder. In some embodiments, the solder material contains Sn, SnAg, SnPb, SnAgCu, SnAgZn, SnZn, SnBiIn, SnIn, SnAu, SnCu, SnZnIn, SnAgSb, or similar soldering alloys. In some embodiments, the solder material is applied as a solder paste.

Figure 1D:
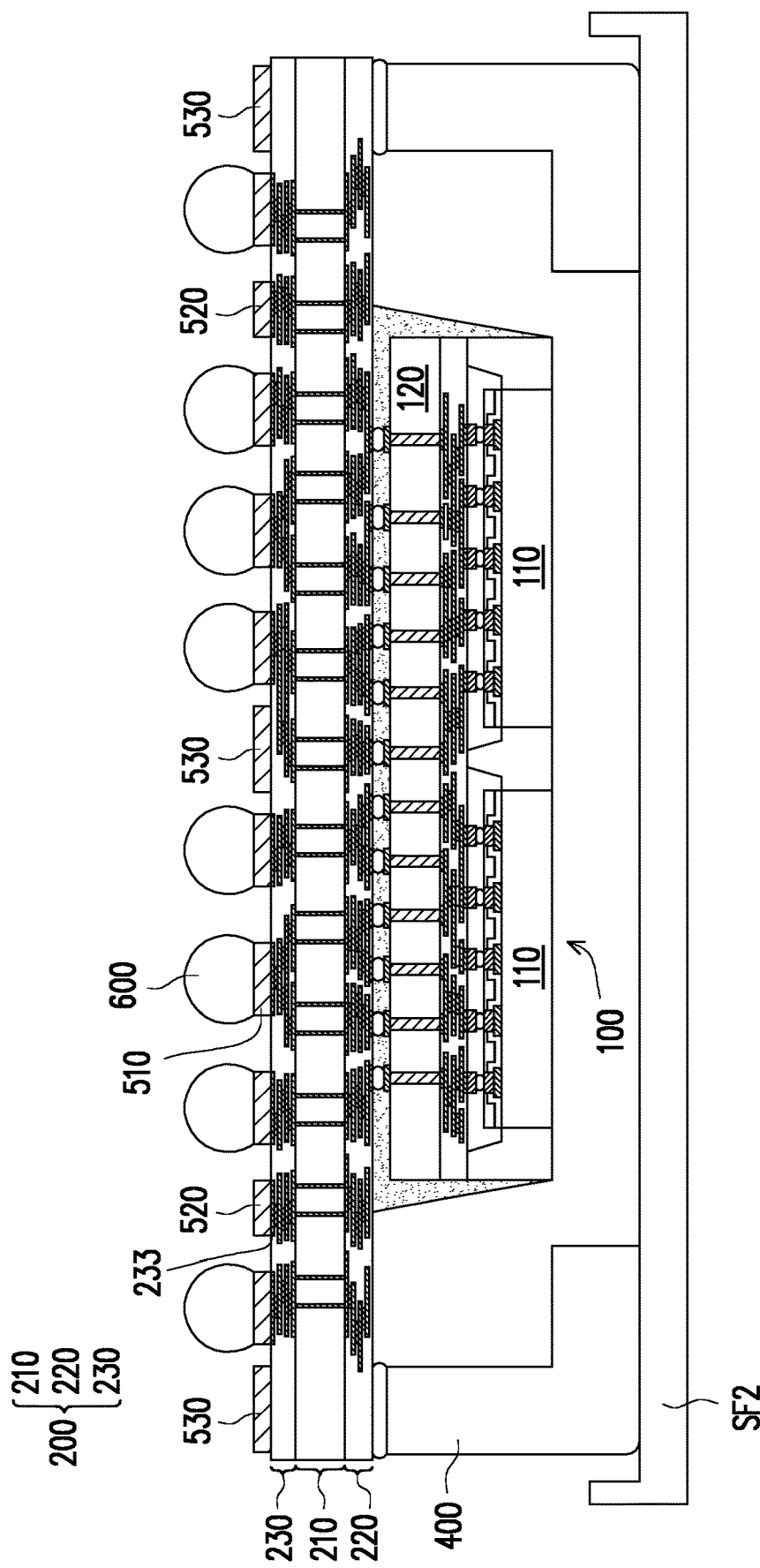
Figure 1E:
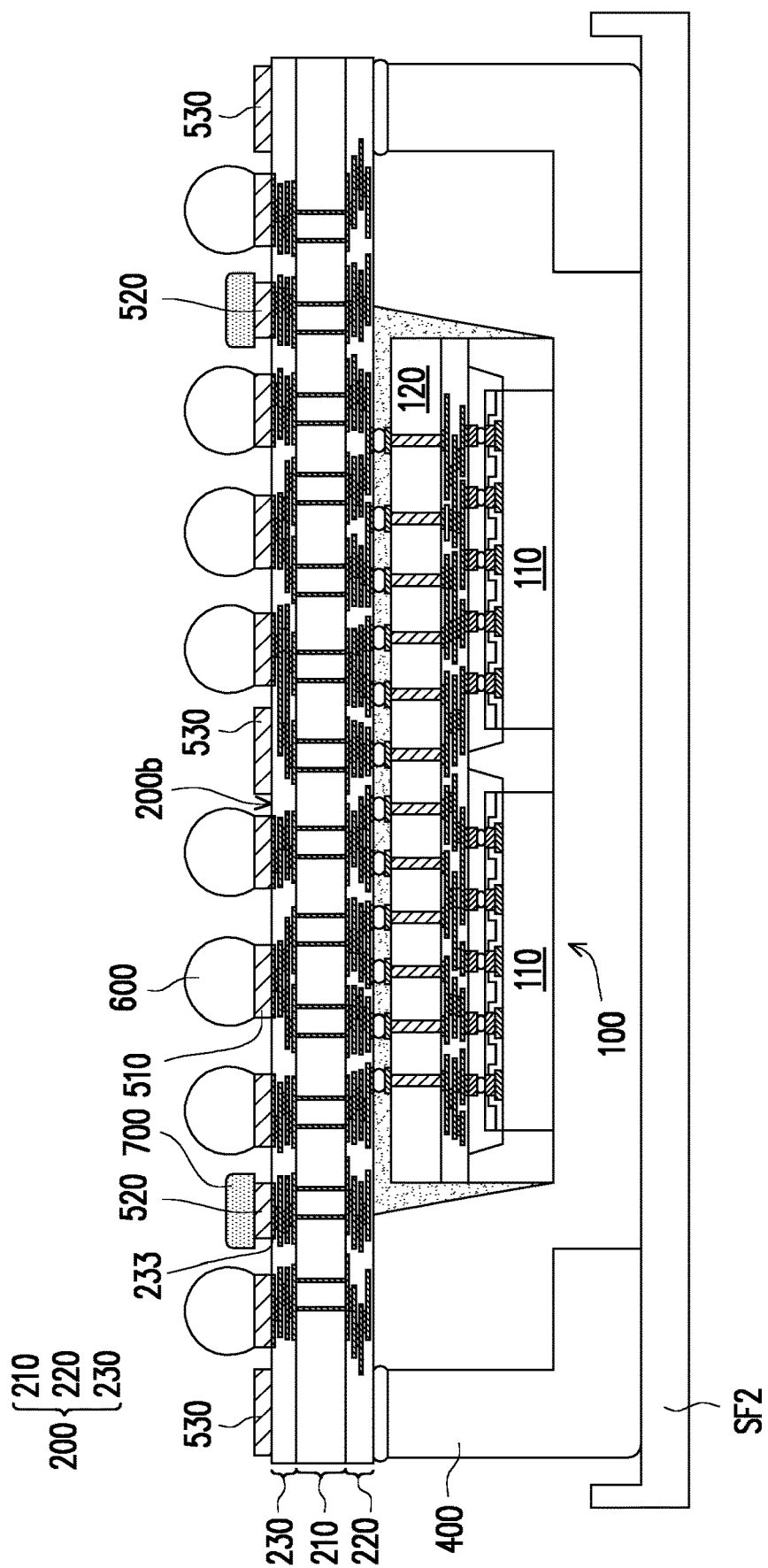
Figure 1F:
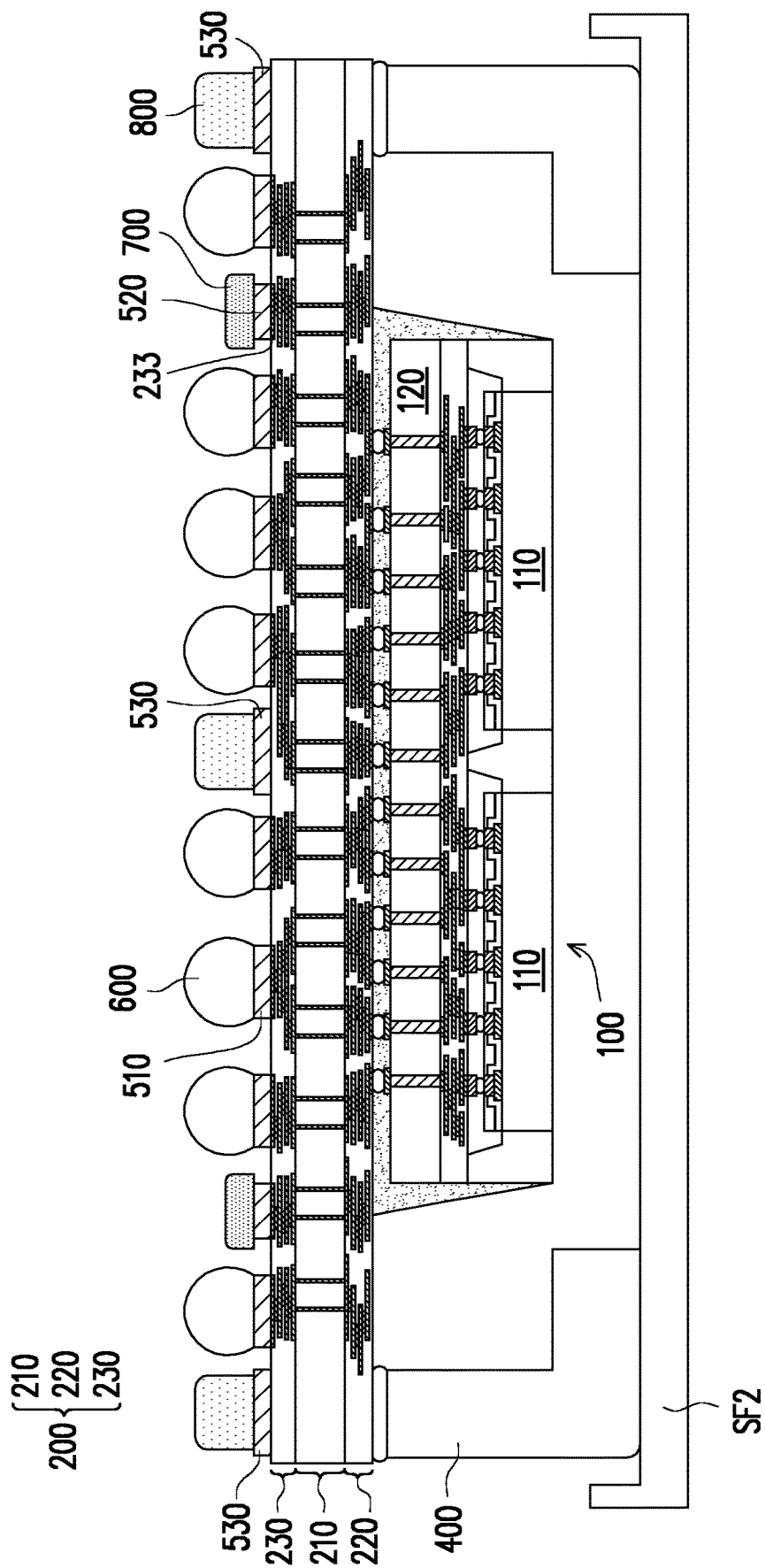

Referring to FIG. 1D, in some embodiments, connective terminals 600 are provided on the portions of solder material 510. In some embodiments, the connective terminals 600 are solder balls for ball grid array mounts. In some embodiments, the connective terminals 600 are electrically connected to the semiconductor package 100 via the circuit substrate 200. Referring to FIG. 1E, in some embodiments passive devices 700 are connected to the circuit substrate 200 via the portions of solder material 520. That is, the passive devices are disposed on the side 200b of the circuit substrate 200 in between the connective terminals 600. In some embodiments, the passive devices 700 are chips including passive devices formed in a semiconductor substrate. In some embodiments, the passive devices 700 are integrated passive devices and may independently function as capacitors, inductors, resistors, or the like. In some embodiments, the passive devices 700 are functional devices, that is, they are electrically connected to the circuit substrate 200 and the semiconductor package 100. Referring to FIG. 1F, in some embodiments supporting posts 800 are installed on the portions of solder material 530, in between the connective terminals 600 and the passive devices 700. In some embodiments, the supporting posts 800 are pre-fabricated pieces of high-temperature melting materials. In some embodiments, the supporting posts 800 are made of a material having a higher melting temperature than a material of the connective terminals 600. For example, the supporting posts 800 may include metals, ceramic materials (e.g., oxides), semiconductor materials (e.g., back side surface mount device, chip caps, passive devices), polymeric materials, combinations thereof, or the like. In some embodiments, when passive devices are used as supporting posts 800, these may be electrically insulated from the circuit substrate 200 (e.g., non-functional passive devices). In some embodiments, one or more reflow process may be performed to secure the connective terminals 600, the passive devices 700 and the supporting posts 800. The supporting posts 800 may be disposed on the portions of solder material 530 via a pick-and-place process. It should be noted that while FIG. 1D through FIG. 1F show the connective terminals 600, the passive device 700 and the supporting posts 800 being disposed on the circuit substrate 200 in this order, the disclosure is not limited thereto. In some alternative embodiments, the supporting posts 800 may be disposed on the circuit substrate 200 before the passive devices 700, the connective terminals 600, or both. In some alternative embodiments, the passive devices 700 may be disposed first on the circuit substrate 200.

Figure 1G:
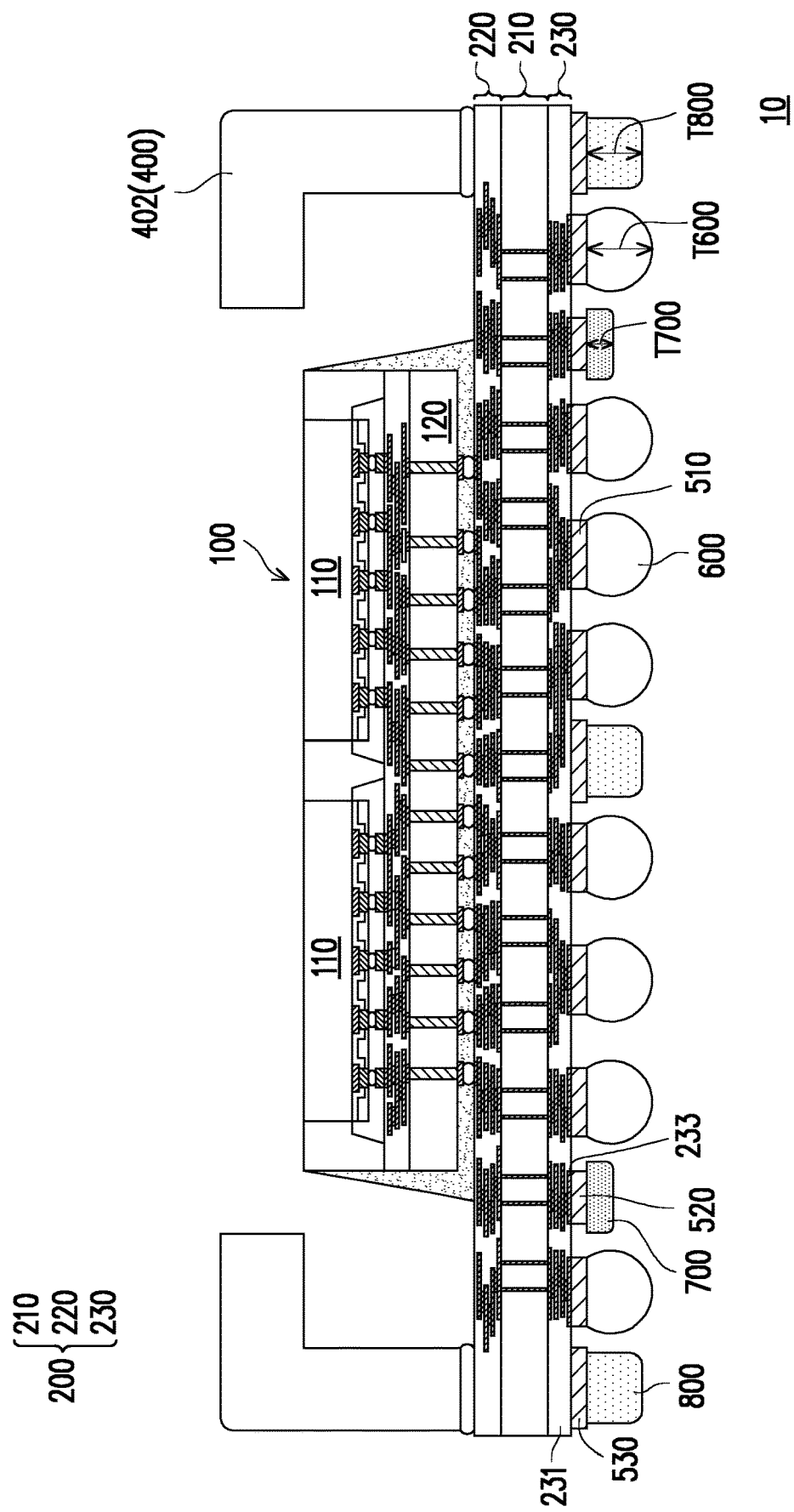

Referring to FIG. 1F and FIG. 1G, in some embodiments, the system may be removed from the supporting frame SF2, and semiconductor devices 10 may be subsequently obtained. In some embodiments, the semiconductor device 10 includes a semiconductor package 100 connected to a substrate 200, a ring 400 disposed on the circuit substrate 200 and surrounding the semiconductor package 100, and connective terminals 600 and supporting posts 800, both disposed on an opposite side of the circuit substrate 200 with respect to the semiconductor package 100. In some embodiments, passive devices 700 may also be disposed on the circuit substrate beside the supporting posts 800 and the connective terminals 600. In some embodiments, the connective terminals 600 and the passive devices 700 (if included) are electrically connected to the semiconductor package 100 via the circuit substrate 200. The supporting posts 800, on the other hand, may be electrically insulated from the circuit substrate 200 and the semiconductor package 100. In some embodiments, the supporting posts 800 are disposed on the circuit substrate 200 overlying the dielectric layer 231 of the build-up stack 230 further away from the semiconductor package 100. In some embodiments, the connective terminals 600, the passive devices 700, and the supporting posts 800 are secured to the circuit substrate 200 via portions of solder material 510, 520, and 530, respectively.

In some embodiments, as illustrated in FIG. 1G, the connective terminals 600 may be thicker (protrude further away from the circuit substrate 200) than the supporting posts 800. In some embodiments, the thickness T600 of the connective terminals 600 may be in the range from 300 μm to 700 μm, and the thickness T800 of the supporting posts 800 may be in the range from 200 μm to 600 μm. In some embodiments, the thickness T800 of the supporting posts 800 may be up to 60 to 85% of the thickness T600 of the connective terminals 600. In some embodiments, the thickness T800 of supporting posts 800 may be in the range from 20 to 100% greater than the thickness T700 of the passive devices 700. In some embodiments, the thickness T700 of the passive devices may be in the range from 50 μm to 300 μm. In some embodiments, the material of the supporting posts 800 may have a higher melting point than the material of the connective terminals 600. In some embodiments, the melting temperature of the supporting posts 800 may be at least 300° C. higher than the melting temperature of the connective terminals 600. For example, the connective terminals 600 may include solder balls which start melting at a temperature in the range from 150 to 260° C., and the supporting posts 800 may include aluminum, stainless steel, copper, silicon or ceramics and start melting at a temperature of about over 1000° C. In some embodiments, the connective terminals 600 may be used to integrate the semiconductor device 10 with other components. In certain embodiments, the supporting posts 800 may help to maintain the standoff height of the connective terminals 600 during high temperature heating step (such as the reflow process).

Figure 1H:
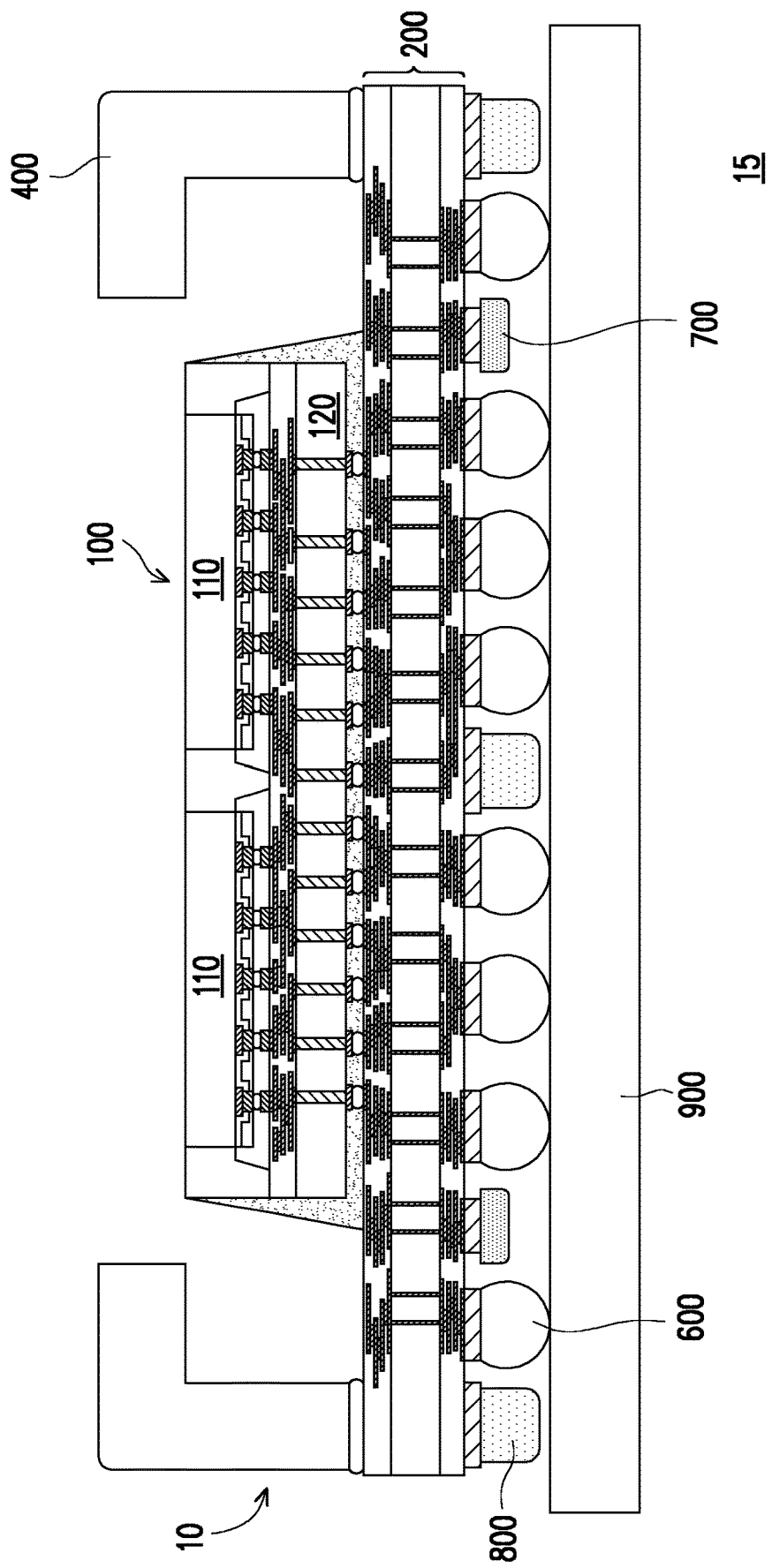
FIG. 1H is a schematic cross-sectional view of an electronic device according to some embodiments of the present disclosure.

For example, FIG. 1H shows a cross-sectional view of an electronic device 15 in which the semiconductor device 10 is connected to a circuit carrier 900 such as a printed circuit board, a mother board, or the like. The connective terminals 600 establish electrical connection between the circuit substrate 200 and the circuit carrier 900. The supporting posts 800 and the passive devices 700 are also sandwiched between the circuit substrate 200 and the circuit carrier 900. The supporting posts 800 may be electrically insulated from both the circuit carrier 900 and the circuit substrate 200. In some embodiments, the semiconductor device 10 may be secured to the circuit carrier 900 via a soldering step, a reflow step, or some other process step requiring heating. In some embodiments, the temperature reached during the heating step may cause some warpage in the circuit substrate 200. In some embodiments, a profile of the circuit substrate 200 following the soldering or reflow step may present some curvature, with some areas (first areas) having a shorter distance from the circuit carrier 900 than other areas (second areas). That is, the first areas may be regions of the circuit substrate 200 that become closer to the circuit carrier 900 following the soldering or reflow step. In some embodiments, the first areas may be referred to as areas of minimum in a warpage profile of the circuit substrate 200. In some embodiments, the supporting posts 800 may be disposed on the circuit substrate 200 in correspondence of the areas of minimum of the warpage profile. For example, the warpage profile may be physically measured for a semiconductor device not including the supporting posts, the areas of minimum of the warpage profile may be determined, and the supporting posts 10 may be disposed in the expected areas of minimum when manufacturing a similar semiconductor device including the supporting posts 800. In some embodiments, the warpage profile may be simulated, and the position of the supporting posts 800 may be determined based on the results of the simulation. In some embodiments, the positions of the supporting posts 800 may be made based on the results of the simulation, and the position (s) may be further refined when manufacturing subsequent batches based on the effectively observed warpage. In some embodiments, because the supporting posts 800 have a melting temperature higher than the temperature at which the soldering or reflow of the connective terminals 600 is performed, the supporting posts 800 may resist deformation during the soldering or reflow step. That is, the supporting posts 800 may offer mechanical resistance against the circuit substrate 200 warping (bending) towards the circuit carrier 900. In some embodiments, by positioning the supporting posts 800 in correspondence of the areas of minimum of the warpage profile, the observed warpage may be reduced compared with the case in which the supporting posts 800 are not included. In some embodiments, the reduced warpage of the circuit substrate 200 may avoid shortening of the connective terminals 600 potentially occurring in the areas of minimum, thus increasing the reliability of an electronic device including the semiconductor device 10.

Figure 2:
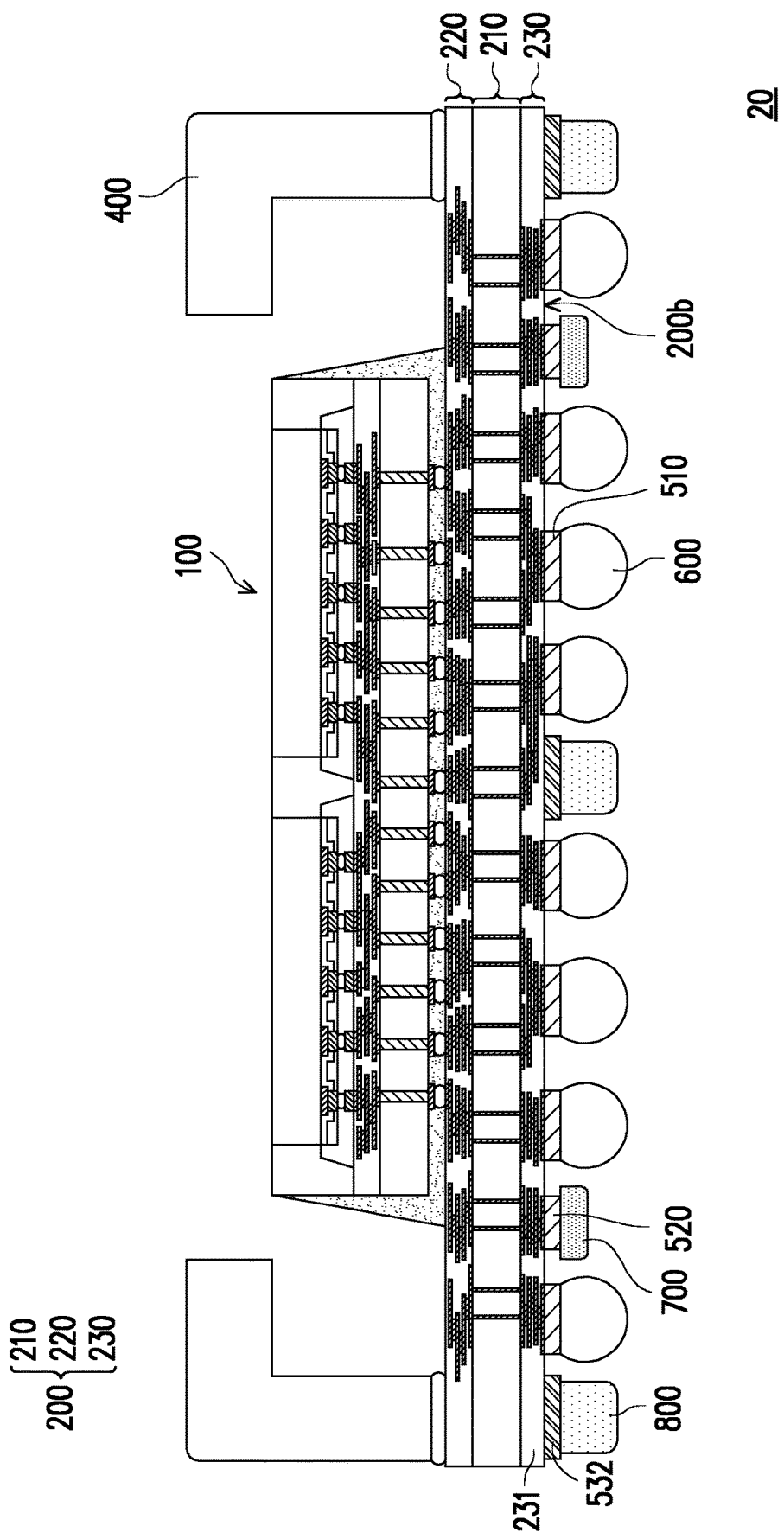
FIG. 2 is a schematic cross-sectional view of a semiconductor device according to some embodiments of the present disclosure.

FIG. 2 is a schematic cross-sectional view of a semiconductor device 20 according to some embodiments of the disclosure. In some embodiments, the semiconductor device 20 may be similar to the semiconductor device 10, and include a semiconductor package 100 connected to a circuit substrate 200, a ring 400 disposed on the circuit substrate 200 and surrounding the semiconductor package 100, connective terminals 600 disposed on the circuit substrate 200 on an opposite side with respect to the semiconductor package 100 and the ring 400, supporting posts 800 disposed on the circuit substrate 200 next to the connective terminals 600 and, optionally, passive devices 700 disposed on the circuit substrate 200 on the same side 200b of the connective terminals 600 and the supporting posts 800. In some embodiments, the semiconductor package 100 is a chip on wafer (CoW) system, but the disclosure is not limited thereto. In some embodiments, a difference between the semiconductor device 10 of FIG. 1G and the semiconductor device 20 of FIG. 2 lies in the material securing the supporting posts 800 to the circuit substrate 200. Because the supporting posts 800 do not need to be electrically connected to the circuit substrate 200 or to the semiconductor package 100, adhesive portions 532 are used in place of the solder portions 530 of the semiconductor device 10. In some embodiments, the adhesive portions 532 comprise a thermoplastic material, a thermocurable material, or a photocurable material. The adhesive portions 532 may comprise epoxy resins, phenol resins, polyolefins, or other suitable materials. In some embodiments, the adhesive portions 532 include organic adhesives. However, the disclosure is not limited thereto, and other materials or polymers compatible with semiconductor processing environments may be used. The adhesive portions 532 may be applied via lamination, spin-coating, or other suitable techniques.

Figure 3A:
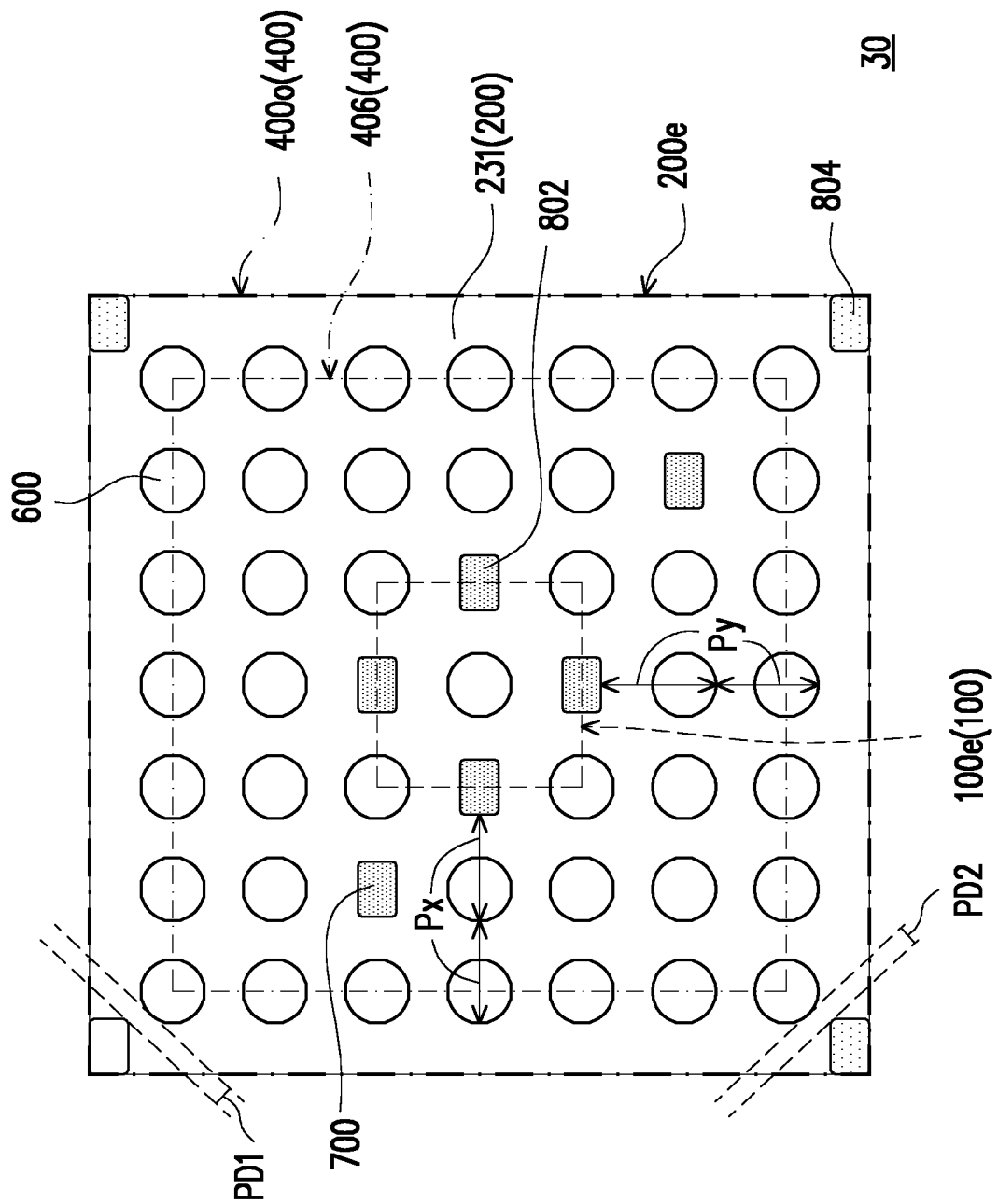
FIG. 3A to FIG. 3E are schematic bottom views of semiconductor devices according to some embodiments of the present disclosure.
Figure 3A:
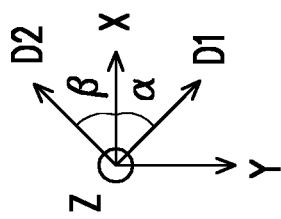

FIG. 3A is a schematic bottom view of a semiconductor device 30 according to some embodiments of the disclosure. In the schematic bottom view of FIG. 3A are illustrated the positions of the connective terminals 600, the passive devices 700, and the supporting posts 802 and 804 over the dielectric layer 231 of the circuit substrate 200. Furthermore, the footprints of the ring 400 and the semiconductor package 100 are also illustrated as dash-dotted and dashed lines, respectively. For the ring 400 are illustrated both the projection of the outer edge 400o and the projection of the surface delimiting the opening 406 (that is, an inner edge of the roof 404 in FIG. 1B), while for the semiconductor package 100 only the outline of the edge 100e is illustrated. It should be noted that the number of connective terminals 600 and passive devices 700 in FIG. 3A is for illustration purpose only, and does not constitute a limit of the disclosure. In some embodiments, more or fewer connective terminals 600 or passive devices 700 may be included depending on the circuit requirements. Similarly, the number of supporting posts is not limited by the disclosure for any of the semiconductor devices presented herein. In some embodiments, more or fewer supporting posts than the ones illustrated in the drawings may be included. In some embodiments, the number and position of the supporting posts may be optimized according to the structural requirements of the semiconductor device. In some embodiments, the connective terminals 600, the supporting posts 802 and the passive devices 700 (if included) are disposed on the circuit substrate in an ordered manner along a first direction X and a second direction Y. In some embodiments, the first direction X and the second direction Y may be perpendicular with respect to each other. In some embodiments, the connective terminals 600, the supporting posts 802 and the passive devices 700 are disposed with a first pitch Px along the first direction X and a second pitch Py along the second direction Y. In some embodiments, the first pitch Px and the second pitch Py are determined according to the sizes of the connective terminals 600, the passive devices 700 and the supporting posts 802. In some embodiments, each of the first pitch Px and the second pitch Py may be independently in the range from 500 to 1500 μm. In some embodiments, the supporting posts 802 are disposed in correspondence of the footprint of the semiconductor package 100. That is, the supporting posts 802 may be disposed so that the outline of the vertical projection of the semiconductor package 100 along a direction Z orthogonal to the directions X and Y falls on the supporting posts 802. In some embodiments, the areas of minimum of the warpage profile for the circuit substrate 200 may fall along the edge 100e of the semiconductor package 100. In some embodiments, the areas of minimum in the warpage profile may be caused by the weight of the semiconductor package 100.

In some embodiments, the supporting posts 804 are positioned at the corners of the circuit substrate 200 along the outer edge 200e, within the footprint of the ring 400. In some embodiments, the closest distance between a supporting post 804 disposed at the corner and the closest connective terminal 600 may lay along a direction skewed with respect to the first direction X and the second direction Y. For example, considering the supporting post 804 in the top left corner of FIG. 3A, the smallest distance PD1 to the closest connective terminal 600 may lay along a direction D1 describing an angle α with the first direction X different than 0 and (positive or negative) integer multiples of π/2 radians. Similarly, for the supporting post 804 in the bottom left corner of FIG. 3A, the smallest distance PD2 to the closest connective terminal 600 may lay along a direction D2 describing an angle β with the first direction X different from the angle α, 0, and (positive or negative) integer multiples of π/2 radians.

Figure 3B:
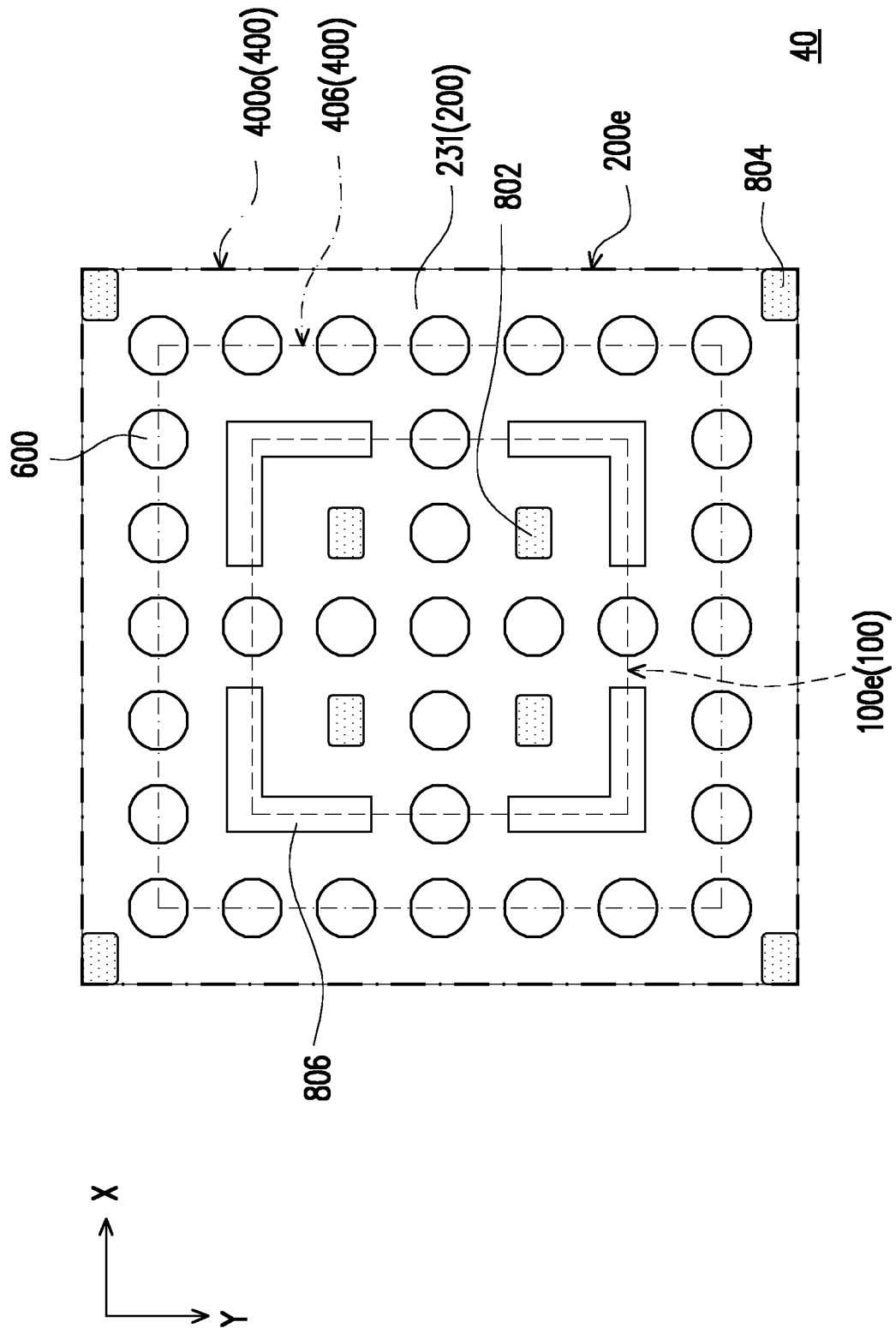

FIG. 3B is a schematic bottom view of a semiconductor device 40 according to some embodiments of the disclosure. As for FIG. 3A, in FIG. 3B are illustrated the positions of the connective terminals 600 and the supporting posts 802, 804 and 806 over the dielectric layer 231 of the circuit substrate 200. Furthermore, the footprints of the ring 400 and the semiconductor package 100 are also illustrated as dash-dotted and dashed lines, respectively. In some embodiments, the semiconductor device 40 does not include passive devices 700. Furthermore, the supporting posts 802 may be misaligned with respect to the edge 100e of the semiconductor package 100. That is, the outline of the vertical projection of the semiconductor package 100 may not fall on the supporting posts 802. In some embodiments, the supporting posts 806 may be disposed in correspondence of the edge 100e of the semiconductor package 100. In some embodiments, the supporting posts 806 may have a bent shape, for example including two sections extending along orthogonal directions from an angle joint. In some embodiments, the supporting posts 806 may be disposed below the corners of the semiconductor package 100, and the two sections may extend below the edge 100e.

Figure 3C:
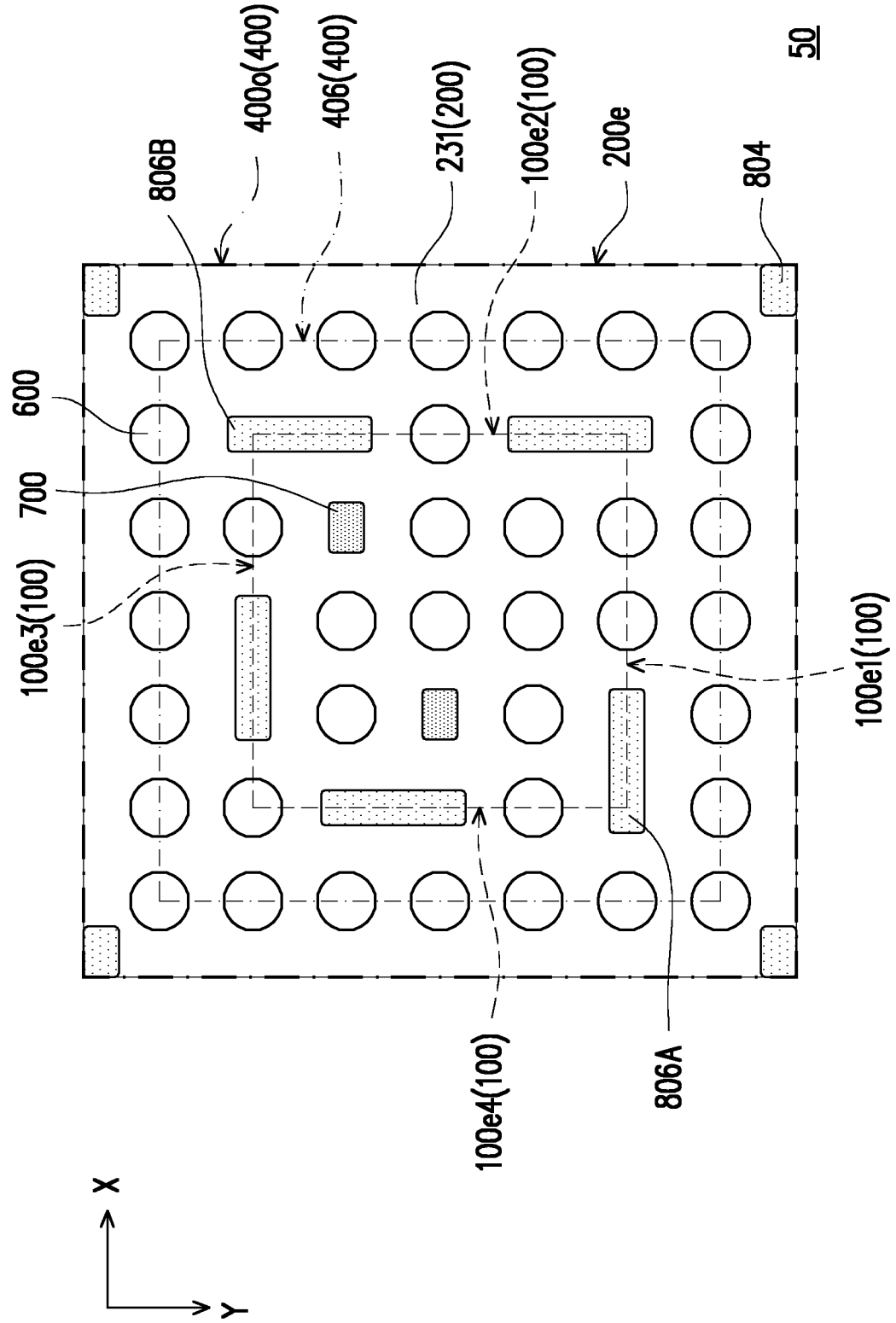

FIG. 3C is a schematic bottom view of a semiconductor device 50 according to some embodiments of the disclosure. As for FIG. 3A, in FIG. 3C are illustrated the positions of the connective terminals 600, the passive devices 700 and the supporting posts 804, 806A and 806B over the dielectric layer 231 of the circuit substrate 200. Furthermore, the footprints of the ring 400 and the semiconductor package 100 are also illustrated as dash-dotted and dashed lines, respectively. In some embodiments, at least some of the supporting posts 806A, 806B have an elongated shape. In some embodiments, the supporting posts 806A have an elongated shape along the first direction X and the supporting posts 806B have an elongated shape along the second direction Y. In some embodiments, the supporting posts 806A, 806B are disposed in correspondence (vertically aligned) with the outline of the vertical projection of the semiconductor package 100, and the directions of elongation of the supporting posts 806A, 806B may match the extension direction of the edge 100e (shown for example in FIG. 1B) of the semiconductor package 100. That is, the supporting posts 806A elongated in the first direction X may be disposed below portions 100e1, 100e3 of the edge 100e of the semiconductor package 100 extending along the first direction X, and the supporting posts 806B elongated in the second direction Y may be disposed below portions 100e2, 100e4 of the edge 100e of the semiconductor package 100 extending along the second direction Y. In some embodiments, one or more connective terminals 600 are disposed between supporting posts 806A, 806B lying under the same portion 100e1, 100e2, 100e3 or 100e4 of the edge 100e of the semiconductor package 100.

Figure 3D:
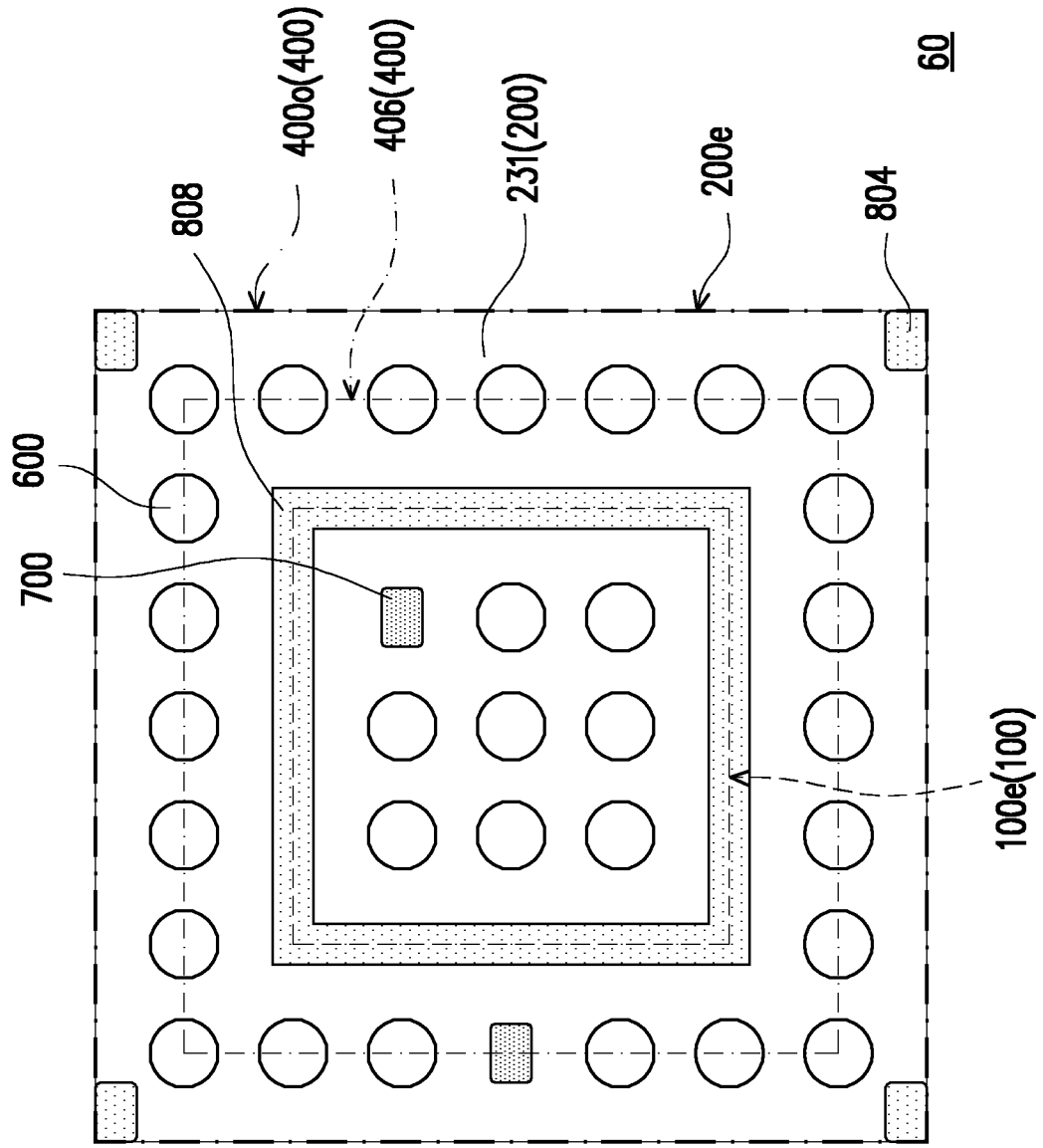

FIG. 3D is a schematic bottom view of a semiconductor device 60 according to some embodiments of the disclosure. As for FIG. 3A, in FIG. 3D are illustrated the positions of the connective terminals 600, the passive devices 700 and the supporting posts 804 and 808 over the dielectric layer 231 of the circuit substrate 200. Furthermore, the footprints of the ring 400 and the semiconductor package 100 are also illustrated as dash-dotted and dashed lines, respectively. In some embodiments, the supporting post 808 has an annular shape, and is disposed below the edge 100e of the semiconductor package 100. That is, the supporting post 808 may form a frame in correspondence of the outline of the vertical projection of the semiconductor package 100. In some embodiments, some of the connective terminals 600 and the passive devices 700 may be disposed in the space enclosed by the frame, and the remaining connective terminals 600 and passive device 700 may be disposed outside the frame. In some embodiments, the supporting post 808 may form a continuous path. That is, the frame may not present gaps. In some alternative embodiments, the frame may present one or more gaps.

Figure 3E:
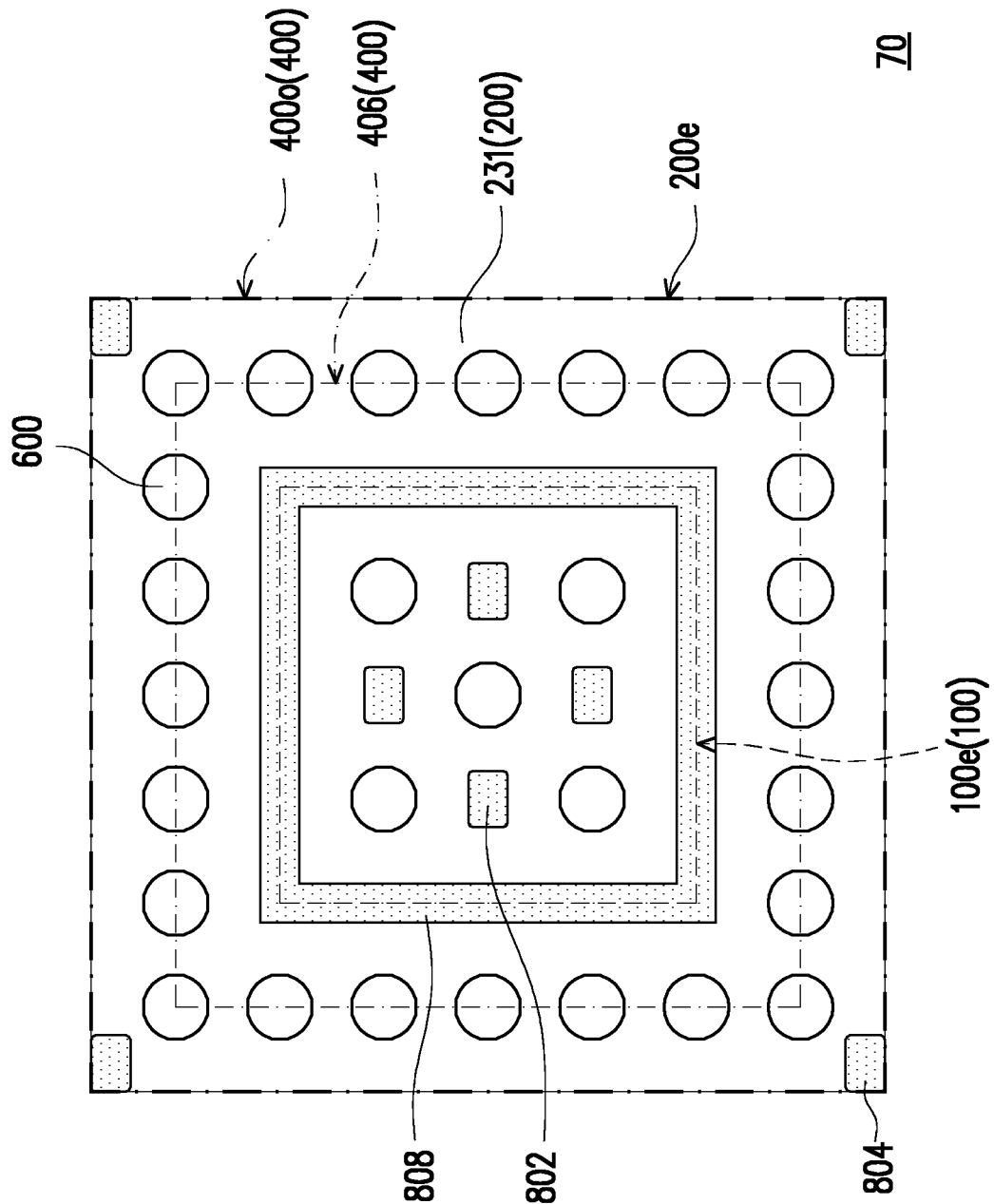

FIG. 3E is a schematic bottom view of a semiconductor device 70 according to some embodiments of the disclosure. As for FIG. 3A, in FIG. 3E are illustrated the positions of the connective terminals 600 and the supporting posts 802, 804 and 808 over the dielectric layer 231 of the circuit substrate 200. Furthermore, the footprints of the ring 400 and the semiconductor package 100 are also illustrated as dash-dotted and dashed lines, respectively. In some embodiments, the semiconductor device 70 includes different types of supporting posts 802, 804 and 808. For example, the semiconductor device 70 may include a supporting post 808 in a frame shape as described for the semiconductor device 60 of FIG. 3D, and may also include supporting posts 802 as described for the semiconductor devices 30 or 40 of FIGS. 3A and 3B. In some embodiments, the semiconductor device 70 may also include the elongated supporting posts 806A or 806B shown in FIG. 3C.

Figure 4A:
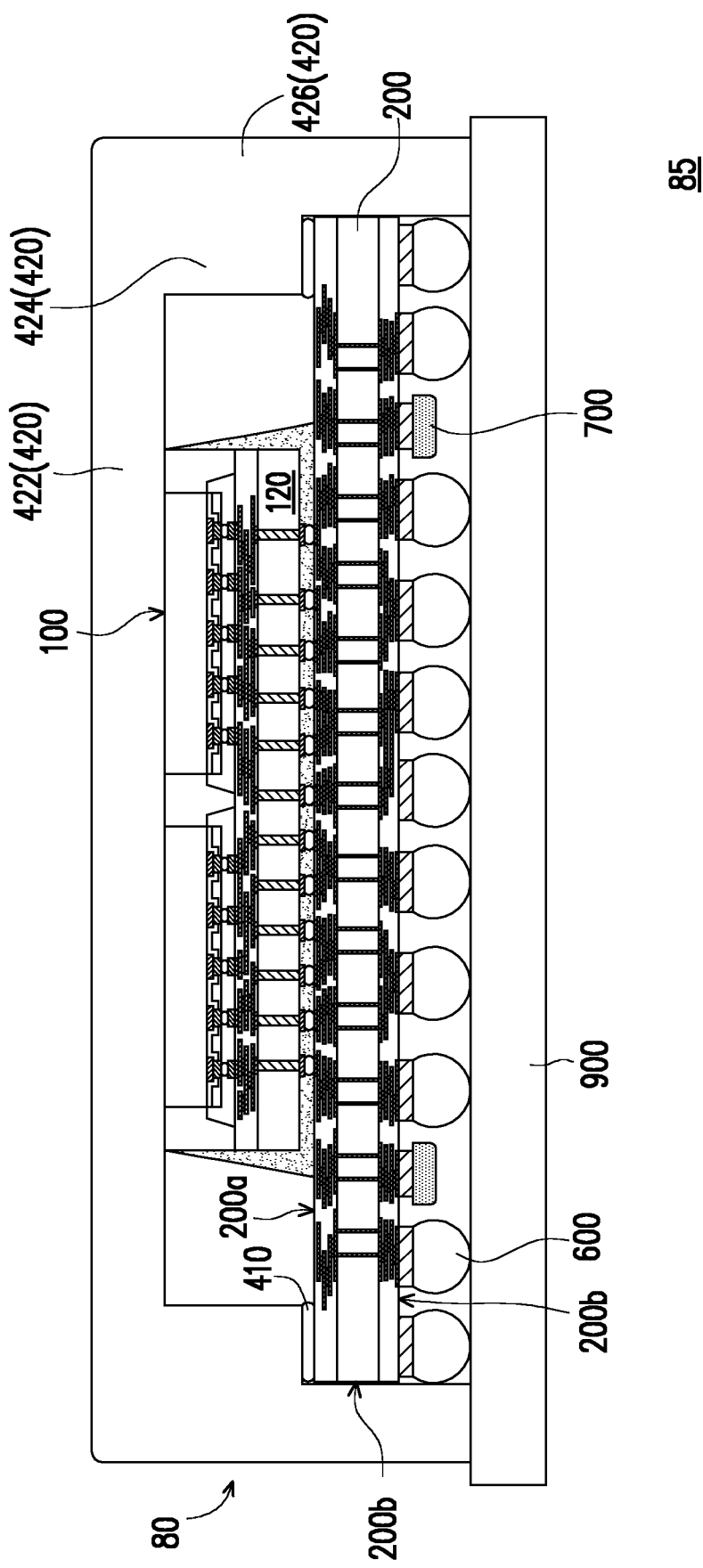
FIG. 4A and FIG. 4B are schematic cross-sectional views of semiconductor devices according to some embodiments of the present disclosure.

FIG. 4A is a schematic cross-sectional view of an electronic device 85 according to some embodiments of the disclosure. The electronic device 85 includes the semiconductor device 80 connected to the circuit carrier 900. The semiconductor device 80 includes the semiconductor package 100 connected to the side 200a of the circuit substrate 200, a cover 420 fixed to the side 200a of the circuit substrate 200, and connective terminals 600 and passive devices 700 disposed on the side 200b of the circuit substrate 200, between the circuit substrate 200 and the circuit carrier 900. In some embodiments, the cover 420 is secured to the circuit substrate 200 by the bonding material 410 disposed at a periphery of the circuit substrate 200. In some embodiments, the cover 420 may promote dissipation of heat produced during usage of the electronic device 85. In some embodiments, the cover 420 includes a lid 422 extending over the semiconductor package 100, fixing flanges 424 extending from the lid 422 up to the circuit substrate 200, and supporting flanges 426 extending from the lid 422 up to the circuit carrier 900. The fixing flanges 424 make contact with the bonding material 410, thus securing the cover 420 to the circuit substrate 200. The supporting flanges 426, on the other hand, reach the circuit carrier 900, extending along the outer edge 200e of the circuit substrate 200 outside of a footprint of the circuit substrate 200. That is, the supporting flanges 426 may contact the circuit carrier 900 outside of an area covered by the circuit substrate 200. In some embodiments, the fixing flanges 424 and the supporting flanges 426 are formed as a single block reaching the circuit substrate 200, where the fixing flanges 424 terminate while the supporting flanges 426 extend further towards the circuit carrier 900. That is, in some embodiments the supporting flanges 426 may be considered a protrusion of the fixing flanges 424, with part of the fixing flanges 424 falling on the bonding material 410 on the circuit substrate 200, and the remaining part of the fixing flanges 424 extending beyond the outer edge 200e of the circuit substrate 200 and reaching the circuit carrier 900 as supporting flanges 426. In some embodiments, the cover 420 is integrally formed from a block of material (e.g., copper) which has a higher melting point than a material of the connective terminals 600. In some embodiments, by contacting the circuit carrier 900, the cover 420 can provide structural support for the electronic device 85. In some embodiments, because the cover 420 has a melting temperature higher than the temperature at which the soldering or reflow of the connective terminals 600 is performed, the cover 420 may resist deformation during the soldering or reflow step. That is, the cover 420 may offer mechanical resistance against the circuit substrate 200 warping (bending) towards the circuit carrier 900. In some embodiments, by including a cover 420 having supporting flanges 426, the observed warpage may be reduced compared with the case in which the supporting flanges 426 are not included. In some embodiments, the reduced warpage of the circuit substrate 200 may avoid shortening of the connective terminals 600 potentially occurring in the areas of minimum, thus increasing the reliability of the electronic device 85.

Figure 4B:
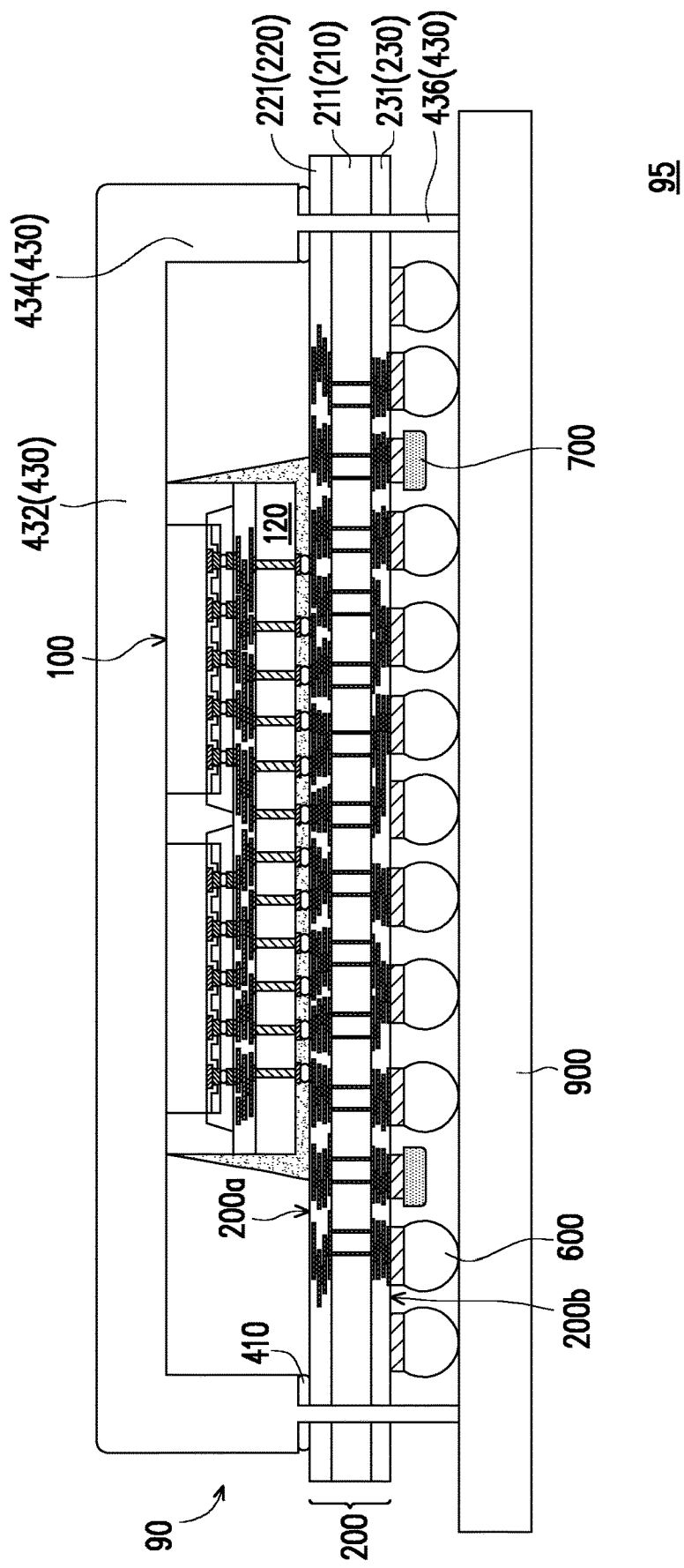

FIG. 4B is a schematic cross-sectional view of an electronic device 95 according to some embodiments of the disclosure. The electronic device 95 includes the semiconductor device 90 connected to the circuit carrier 900. The semiconductor device 90 includes the semiconductor package 100 connected to the side 200*a* of the circuit substrate 200, a cover 430 fixed to the side 200*a* of the circuit substrate 200, and connective terminals 600 and passive devices 700 disposed on the side 200*b* of the circuit substrate 200, between the circuit substrate 200 and the circuit carrier 900. In some embodiments, the cover 430 is secured to the circuit substrate 200 by the bonding material 410 disposed on the side 200*a* of the circuit substrate 200. In some embodiments, the cover 430 includes a lid 432 extending over the semiconductor package 100, fixing flanges 434 extending from the lid 432 up to the circuit substrate 200, and supporting flanges 436 extending from the fixing flanges 434 up to the circuit carrier 900. The fixing flanges 434 make contact with the bonding material 410, thus securing the cover 430 to the circuit substrate 200. The supporting flanges 436, on the other hand, penetrate through the circuit substrate 200 to reach the circuit carrier 900. That is, the supporting flanges 436 may cross through the dielectric layers 211, 221, 231 of the core layer 210 and the build-up layers 220, 230 to reach the circuit carrier 900. In some embodiments, the circuit substrate 200 may be perforated before installing the cover 430 to accommodate the supporting flanges 436. In some embodiments, the cover 430 is integrally formed from a block of material (e.g., copper) which has a higher melting point than a material of the connective terminals 600. In some embodiments, by contacting the circuit carrier 900, the cover 430 can provide structural support for the electronic device 95. In some embodiments, because the cover 430 has a melting temperature higher than the temperature at which the soldering or reflow of the connective terminals 600 is performed, the cover 430 may resist deformation during the soldering or reflow step. That is, the cover 430 may offer mechanical resistance against the circuit substrate 200 warping (bending) towards the circuit carrier 900. In some embodiments, the supporting flanges 436 may be made to contact the circuit carrier 900 in correspondence of the areas of minimum of the warpage profile. By doing so, the observed warpage may be reduced compared with the case in which the supporting flanges 436 are not included. In some embodiments, the reduced warpage of the circuit substrate 200 may avoid shortening of the connective terminals 600 potentially occurring in the areas of minimum, thus increasing the reliability of the electronic device 95.

In an electronic device according to some embodiments, electrical connection between a circuit substrate and a circuit carrier is established via connective terminals. In some embodiments, electrically floating supports are included between the circuit substrate and the circuit carrier beside the connective terminals. In some embodiments, the supports may be supporting posts secured to the circuit substrate via solder material. In some alternative embodiments, the supports may be supporting flanges of a cover secured to the circuit substrate, for example via a bonding material. In some alternative embodiments, the supports may be passive devices disposed on the circuit substrate on the same side of the connective terminals. The passive devices used as supports may be electrically insulated from the circuit substrate. In some embodiments, a material of the supports has a higher melting temperature (starts melting at a higher temperature) than a material of the connective terminals. In some embodiments, the supports may offer mechanical resistance against the circuit substrate warping (bending) towards the circuit carrier. In some embodiments, the supports may contact the circuit carrier in correspondence of the areas of minimum of the warpage profile of the circuit carrier, possibly reducing the observed warpage compared with the case in which the supports are not included. In some embodiments, the reduced warpage of the circuit substrate may avoid shortening of the connective terminals potentially occurring in the areas of minimum of the warpage profile, thus increasing the reliability of the device.

In accordance with some embodiments of the disclosure, a semiconductor device is provided. The semiconductor device includes a circuit substrate, a semiconductor package, connective terminals and supports. The circuit substrate has a first side and a second side opposite to the first side. The semiconductor package is connected to the first side of the circuit substrate. The connective terminals are located on the second side of the circuit substrate and are electrically connected to the semiconductor package via the circuit substrate. The supports are located on the second side of the circuit substrate beside the connective terminals. A material of the supports has a melting temperature higher than a melting temperature of the connective terminals.

In accordance with some embodiments of the disclosure, an electronic device is provided. The electronic device includes a circuit carrier and a semiconductor device connected to the circuit carrier. The semiconductor device comprises a circuit substrate, a semiconductor package, connective terminals, and supporting posts. The circuit substrate has a core layer sandwiched between a first build-up layer and a second build-up layer. The semiconductor package is connected to the first build-up layer. The connective terminals are connected to the second build-up layer and are electrically connected to the semiconductor package via the circuit substrate. The supporting posts are located on the second build-up layer beside the connective terminals and are electrically insulated from the circuit substrate. The connective terminals and the supporting posts are disposed between the circuit carrier and the circuit substrate. The supporting posts have a first melting temperature higher than a second melting temperature of the connective terminals.

In accordance with some embodiments of the disclosure, a manufacturing method of an electronic device is provided. The manufacturing method includes the following steps. A semiconductor package is connected to a first side of a circuit substrate. Connective terminals are disposed on a second side of the circuit substrate opposite to the first side. Supporting posts are disposed on the second side of the circuit substrate. The supporting posts have a first melting temperature higher than a second melting temperature of the connective terminals. A heating step is performed to attach the circuit substrate to a circuit carrier through the connective terminals. The heating step is performed at a temperature higher than the second melting temperature and lower than the first melting temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of an electronic device, comprising:

attaching a semiconductor package to a first side of a circuit substrate, wherein a second side of the circuit substrate is supported by a first supporting frame during the attachment;

disposing a ring on the first side of the circuit substrate, wherein the semiconductor package is laterally surrounded by the ring;

attaching a second supporting frame to the ring, and removing the first supporting frame;

disposing connective terminals and supporting posts on the second side of the circuit substrate, wherein the supporting posts have a first melting temperature higher than a second melting temperature of the connective terminals, and a first group of the supporting posts are separately arranged along a path substantially aligned with an outline of a vertical projection of the semiconductor package;

performing a heating step to attach the circuit substrate to a circuit carrier through the connective terminals, wherein the heating step is performed at a temperature higher than the second melting temperature and lower than the first melting temperature; and removing the second supporting frame.

2. A manufacturing method of an electronic device, comprising:

providing a circuit substrate with a first side and a second side facing away from the first side;

attaching a semiconductor package to the first side of the circuit substrate;

disposing a ring on the first side of the circuit substrate, wherein the semiconductor package is laterally surrounded by the ring;

disposing connective terminals on the second side of the circuit substrate;

disposing supporting posts on the second side of the circuit substrate, wherein the supporting posts have a first melting temperature higher than a second melting temperature of the connective terminals, and a first group of the supporting posts are separately arranged along a path substantially aligned with an outline of a vertical projection of the semiconductor package, and a second group of the supporting posts are disposed at corners of the circuit substrate below the ring; and performing a heating step to attach the circuit substrate to a circuit carrier through the connective terminals, wherein the heating step is performed at a temperature higher than the second melting temperature and lower than the first melting temperature.

3. The manufacturing method of the electronic device according to claim 2, wherein a height of the ring is greater than a height of the semiconductor package.

4. The manufacturing method of the electronic device according to claim 2, wherein an outer edge of the ring is substantially aligned with an outer edge of the circuit substrate.

5. The manufacturing method of the electronic device according to claim 2, wherein the connective terminals are thicker than the supporting posts.

6. The manufacturing method of the electronic device according to claim 2, wherein the ring comprises a flange standing on the first side of the circuit substrate, and comprises a roof laterally extending from a top portion of the flange.

7. The manufacturing method of the electronic device according to claim 6, wherein an opening is defined by a sidewall of the roof, and the semiconductor package is overlapped with the opening.

8. A manufacturing method of an electronic device, comprising:

connecting a semiconductor package to a first side of a circuit substrate;

disposing connective terminals on a second side of the circuit substrate opposite to the first side;

disposing supporting posts on the second side of the circuit substrate, wherein the supporting posts have a first melting temperature higher than a second melting temperature of the connective terminals, and a first group of the supporting posts are separately arranged along a path substantially aligned with an outline of a vertical projection of the semiconductor package, and a second group of the supporting posts are disposed at corners of the circuit substrate; and performing a heating step to attach the circuit substrate to a circuit carrier through the connective terminals, wherein the heating step is performed at a temperature higher than the second melting temperature and lower than the first melting temperature.

9. The manufacturing method of the electronic device according to claim 8, wherein a group of the connective terminals and the first group of the supporting posts are arranged along the outline of the vertical projection of the semiconductor package.

10. The manufacturing method of the electronic device according to claim 8, wherein the connective terminals and the supporting posts are arranged along a first direction and a second direction perpendicular to the first direction, a shortest distance between one in the second group of the supporting posts and a closest one of the connective terminals lay along a third direction intersected with the first and second directions.

11. The manufacturing method of the electronic device according to claim 8, wherein the connective terminals and the first group of the supporting posts are laterally surrounded by the second group of the supporting posts.

12. The manufacturing method of the electronic device according to claim 8, wherein the second side of the circuit substrate is supported by a first supporting frame while connecting the semiconductor package to the first side of the circuit substrate, and the first supporting frame is removed before disposing the connective terminals and the supporting posts.

13. The manufacturing method of the electronic device according to claim 8, wherein the semiconductor package and the circuit substrate are supported via a second supporting frame while disposing the connective terminals and the supporting posts, and the second supporting frame is removed after formation of the connective terminals and the supporting posts.

14. The manufacturing method of the electronic device according to claim 8, wherein the connective terminals are thicker than the supporting posts.

15. The manufacturing method of the electronic device according to claim 8, wherein the supporting posts are located within a minimum warpage area of the circuit substrate.

16. The manufacturing method of the electronic device according to claim 8, further comprising dispensing a solder material on the second side of the circuit substrate before disposing the connective terminals and the supporting posts.

17. The manufacturing method of the electronic device according to claim 16, wherein first portions of the solder material are disposed in electrical contact with conductive patterns in the circuit substrate, second portions of the solder material are disposed on a dielectric layer of the circuit substrate, the connective terminals are disposed on the first portions of the solder materials, and the supporting posts are disposed on the second portions of the solder material.

18. The manufacturing method of the electronic device according to claim 8, further comprising disposing passive devices on the second side of the circuit substrate.

19. The manufacturing method of the electronic device according to claim 18, wherein the connective terminals and the passive devices are electrically connected to conductive patterns in the circuit substrate, and the supporting posts are electrically insulated from the conductive patterns.

20. The manufacturing method of the electronic device according to claim 18, wherein a thickness of the supporting posts is in the range from 20 to 100% greater than a thickness of the passive devices.

* * * * *